United States Patent
Egara et al.

[11] Patent Number: 5,185,548
[45] Date of Patent: Feb. 9, 1993

[54] SURFACE ACOUSTIC WAVE DEVICE WITH REFLECTED WAVE AT SIDE EDGES ON WAVEGUIDE SUPPRESSED AND COMMUNICATION SYSTEM USING THE SAME

[75] Inventors: Koichi Egara, Tokyo; Kenji Nakamura, Hadano; Norihiro Mochizuki, Atsugi, all of Japan

[73] Assignee: Canon Kabushiki Kaisha, Tokyo, Japan

[21] Appl. No.: 772,951

[22] Filed: Oct. 8, 1991

[30] Foreign Application Priority Data

| Oct. 11, 1990 | [JP] | Japan | 2-270488 |
| Oct. 11, 1990 | [JP] | Japan | 2-270489 |
| Oct. 11, 1990 | [JP] | Japan | 2-270490 |
| Nov. 19, 1990 | [JP] | Japan | 2-311595 |

[51] Int. Cl.$^5$ ............................................. H01L 41/08
[52] U.S. Cl. ........................... 310/313 D; 310/313 B; 333/195; 364/821
[58] Field of Search ............... 310/313 D, 313 B; 333/151, 194, 195; 455/39, 227, 296; 364/819, 821

[56] References Cited

U.S. PATENT DOCUMENTS

| 4,028,649 | 6/1977 | Komatsu et al. | 310/313 B |
| 4,114,116 | 9/1978 | Reeder | 364/821 |
| 4,556,949 | 12/1985 | Solie | 364/821 |
| 4,675,839 | 6/1987 | Kerr | 364/821 |
| 4,764,701 | 8/1988 | Garbacz et al. | 310/313 B |
| 4,841,470 | 6/1989 | Okamoto et al. | 364/821 |
| 4,882,715 | 11/1989 | Egara et al. | 310/313 B |
| 5,003,213 | 3/1991 | Mochuzuki et al. | 310/313 D |
| 5,073,898 | 12/1991 | Endo et al. | 375/1 |

FOREIGN PATENT DOCUMENTS

| 0373404 | 6/1990 | European Pat. Off. . |
| 0082705 | 3/1989 | Japan ............... 333/194 |
| 02207605 | 8/1990 | Japan . |

OTHER PUBLICATIONS

Yasuhiko Nakagawa, et al., "Surface Acoustic Wave Convolver Using Multiple Waveguide", Electronic Communications Society Journal, vol. J69-C, No. 2, pp. 190-198 (1986) (and English translation).

"A Saw Planar Piezoelectric Convolver" by P. Defranould et al. Proceedings of IEEE, vol. 64, No. 5, May 1976.

*Primary Examiner*—Mark O. Budd
*Assistant Examiner*—Thomas M. Dougherty
*Attorney, Agent, or Firm*—Fitzpatrick, Cella, Harper & Scinto

[57] ABSTRACT

A surface acoustic wave device comprises a substrate, a plurality of input transducers formed on the substrate for generating first and second surface acoustic waves propagating in opposite directions to each other, and a plurality of waveguides arranged in a direction orthogonal to the propagating direction of the first and second surface acoustic waves on a region where the first and second surface acoustic waves overlap. Each waveguide producing a third surface acoustic wave propagating in a direction where the waveguides are arranged, with the interaction between the first and second surface acoustic waves, and on at least two of the waveguides, third surface acoustic waves reflected at respective side edges cancel each other, and an output transducer converts the third surface acoustic waves propagating from the waveguides into an electrical signal.

65 Claims, 24 Drawing Sheets

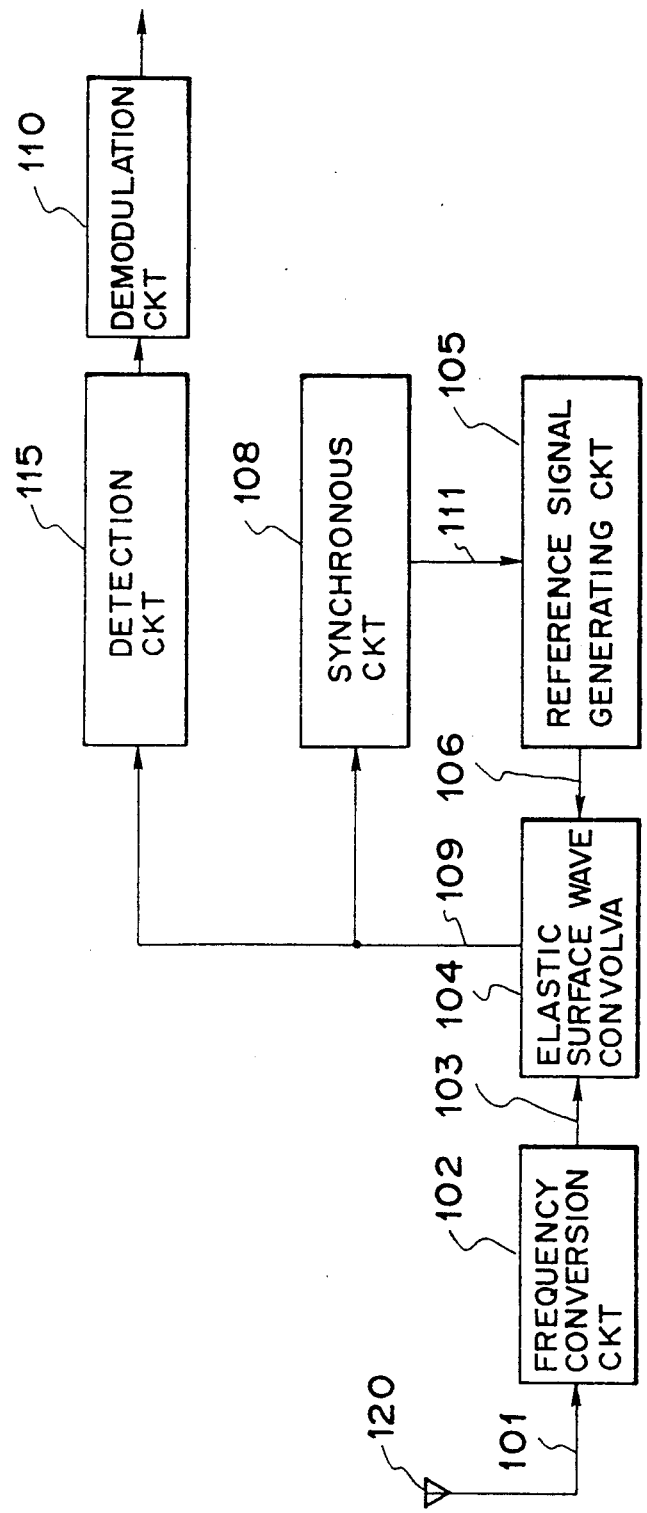

SURFACE ACOUSTIC WAVE DEVICE WITH REFLECTED WAVE AT SIDE EDGES ON WAVEGUIDE SUPPRESSED AND COMMUNICATION SYSTEM USING THE SAME

BACKGROUND OF THE INVENTION

1. Field of the Invention

The present invention relates to a surface acoustic wave device and a communication system using it wherein a plurality of surface acoustic waves are propagated on a substrate and a signal produced with the interaction of these surface acoustic waves is picked up by the use of the physical non-linear effect of the substrate.

2. Related Background Art

The surface acoustic wave device has been increasingly important in recent years,.as a key device in making the spread spectrum communication. Also, it has been noted in many applications as the real-time signal processing device and studied actively.

FIG. 1 is a schematic plan view showing an example of such a conventional surface acoustic wave device.

In the same figure, there is provided on a piezoelectric substrate 1 pair of input interdigital transducers 2 and a central electrode 3 therebetween. The transducers 2 are electrodes for exciting surface acoustic wave signals, while the central electrode 3 is an electrode for propagating the surface acoustic wave signals in opposite directions to each other and for picking up an output signal.

If a signal $F(t)\exp(j\omega t)$ is applied to one of the transducers 2, and a signal $G(t)\exp(j\omega t)$ to the other, two surface acoustic waves in opposite directions to each other $$F(t-x/v)\exp[j\omega(t-x/v)]$$

and $$G(t-(L-x)/v)\exp[j\omega(t-(L-x)/v)]$$

will propagate on a surface of the piezoelectric substrate 1. Where v is the velocity of surface acoustic wave and L is the length of central electrode 3.

On this propagation path, a product component of above surface acoustic waves is yielded due to the non-linear effect, integrated over a range of the central electrode 3, and then picked up. This output signal H(t) can be represented by the following expression.

$$H(t)=\alpha \cdot \exp(j2\omega t)\int_0^L F(t-x/v)G(t-(L-x)/v)dx$$

Where $\alpha$ is a proportional constant.

Thus, a convolution signal of two signals F(t) and G(t) can be obtained from the central electrode 3.

However, as such a constitution has generally a lower efficiency, a surface acoustic wave device as shown in FIG. 2 has been proposed by Nakagawa et al. in "Electronic communications society journal" 1986/2, Vol. j69-C, No. 2, pp190-198. Note that the axis of coordinate as shown in FIG. 2 was appended for convenience, but not meaning the crystal axis of substrate.

In FIG. 2, 11 is a piezoelectric substrate, and 12, 13 are two input interdigital transducers for excitation of surface acoustic waves formed on a surface of the substrate 1, opposed to each other and spaced by an appropriate distance in the x direction, 14-1, 14-2, ..., 14-n are waveguides formed on the surface of substrate 11 extending in parallel to each other in the x direction between the transducers 12, 13, and 15 is an output interdigital transducer formed on the surface of the substrate 11, spaced by an appropriate distance in the y direction from the above-mentioned waveguides.

In this surface acoustic wave device, if an electric signal with an angular frequency $\omega$ is input to the transducers 12, 13 for excitation of surface acoustic waves, the surface acoustic waves of that frequency will be excited, and propagate on the waveguides 14-1, 14-2, ..., 14-n in the x direction but in opposite directions to each other, in which a surface acoustic wave with an angular frequency $2\omega$ propagating in the y direction will be produced on the waveguides due to the parametric mixing phenomenon. This surface acoustic wave arrives at the output transducer 15 in which a convolution electric signal for two input signals as above indicated can be obtained.

However, with the surface acoustic wave device as shown in FIG. 2, there was a problem that the reflected waves might be produced at side edges (end faces) of the waveguide for surface acoustic wave, interfering with the surface acoustic wave indicating the signal passing toward the output transducer. And with the conventional surface acoustic wave device as above described, each divided waveguide is formed at a pitch equal to a whole multiple of the wavelength of surface acoustic waves produced by these waveguides, so that surface acoustic waves reflected at an end face on the same side in the y axis direction of each waveguide are intensified with each other, thereby increasing the reflectance on all of the waveguides. Thus, there was a problem of having a bad effect on the output signal of the surface acoustic device, such that the waveguides and the output transducer may constitute a resonator, producing the distortion or ripples in the frequency characteristics of the convolution signal, for example.

SUMMARY OF THE INVENTION

An object of the present invention is to resolve the above conventional technical problems and to provide a surface acoustic wave device and a communication system using it, wherein an output signal having excellent characteristics can be obtained.

In order to accomplish the above object, according to the first embodiment of the present invention, there is provided a surface acoustic wave device comprising, a substrate, a plurality of input transducers formed on the substrate for generating first and second surface acoustic waves propagating in opposite directions to each other, a plurality of waveguides arranged in a direction orthogonal to the propagating direction of those surface acoustic waves on a region where the first and second surface acoustic waves overlap, each waveguide producing a third surface acoustic wave propagating in a direction where the waveguides are arranged, with the interaction between the first and second surface acoustic waves, and on at least two of those waveguides, the third surface acoustic waves reflected at respective side edges canceling each other, and an output transducer for converting the third surface acoustic waves propagating from the waveguides into an electric signal.

According to the second embodiment of the present invention, there is provided a surface acoustic wave device comprising, a substrate, a plurality of input transducers formed on the substrate for generating first and second surface acoustic waves propagating in opposite directions to each other, a plurality of waveguides arranged in a direction orthogonal to the propagating direction of those surface acoustic waves on a region where the first and second surface acoustic waves overlap, each waveguide producing a third surface acoustic wave propagating in a direction where the waveguides are arranged, with the interaction between the first and second surface acoustic waves, and on at least two of those waveguides, the distance between side edges on at least one side of the waveguide in the direction where the waveguides are arranged being an odd multiple of a quarter wavelength of the third surface acoustic wave, and an output transducer for converting the third surface acoustic waves propagating from the waveguide into an electric signal.

According to the third embodiment of the present invention, there is provided a surface acoustic wave device comprising, a substrate, a plurality of input transducers formed on the substrate for generating first and second surface acoustic waves propagating in opposite directions to each other, a plurality of waveguides arranged in a direction orthogonal to the propagating direction of those surface acoustic waves on a region where the first and second surface acoustic waves overlap, each waveguide producing a third surface acoustic wave propagating in a direction where the waveguides are arranged, with the interaction between the first and second surface acoustic waves, and the distances between edges on the same side for a waveguide in the direction where the waveguides are arranged being random, and an output transducer for converting the third surface acoustic waves propagating from the waveguide into an electric signal.

According to the fourth embodiment of the present invention, there is provided a surface acoustic wave device comprising, a substrate, a plurality of input transducers formed on the substrate for generating first and second surface acoustic waves propagating in opposite directions to each other, a plurality of waveguides arranged in a direction orthogonal to the propagating direction of those surface acoustic waves on a region where the first and second surface acoustic waves overlap, each waveguide producing a third surface acoustic wave propagating in a direction where the waveguides are arranged, with the interaction between the first and second surface acoustic waves, each waveguide being divided into a plurality of regions in the propagating direction of the first and second surface acoustic waves, and on each waveguide, a side edge of each region having a step in a magnitude of an odd multiple of a quarter wavelength of the third surface acoustic wave in the direction where the waveguides are arranged, and an output transducer for converting the third surface acoustic waves propagating from the waveguides into an electric signal.

According to the fifth embodiment of the present invention, there is provided a surface acoustic wave device comprising, a substrate, a plurality of input transducers formed on the substrate for generating first and second surface acoustic waves propagating in opposite directions to each other, a plurality of waveguides arranged in a direction orthogonal to the propagating direction of those surface acoustic waves on a region where the first and second surface acoustic waves overlap, each waveguide producing a third surface acoustic wave propagating in a direction where the waveguides are arranged, with the interaction between the first and second surface acoustic waves, and an output transducer for converting the third surface acoustic waves propagating from the waveguides into an electric signal, the output transducer being divided into a plurality of sections in the propagating direction of the first and second surface acoustic waves, each section having a step in a magnitude of an odd multiple of a quarter wavelength of the third surface acoustic wave in the direction where the waveguides are arranged.

Also, there is provided a communication system using a surface acoustic wave device comprising, (a) a transmitter for transmitting a signal modulated in accordance with the information, (b) a circuit for receiving a modulated signal transmitted from the transmitter, (c) a circuit for generating a reference signal, (d) a surface acoustic wave device according to any one of the first to fifth embodiments as above described for outputting a convolution signal of a signal received in a reception circuit and the reference signal, and (e) a circuit for demodulating the information using the convolution signal output from the surface acoustic wave device.

BRIEF DESCRIPTION OF THE DRAWINGS

FIGS. 23 to 25, are block diagrams showing variations of a receiver as shown in FIG. 21.

DETAILED DESCRIPTION OF THE PREFERRED EMBODIMENTS

Figure 1:
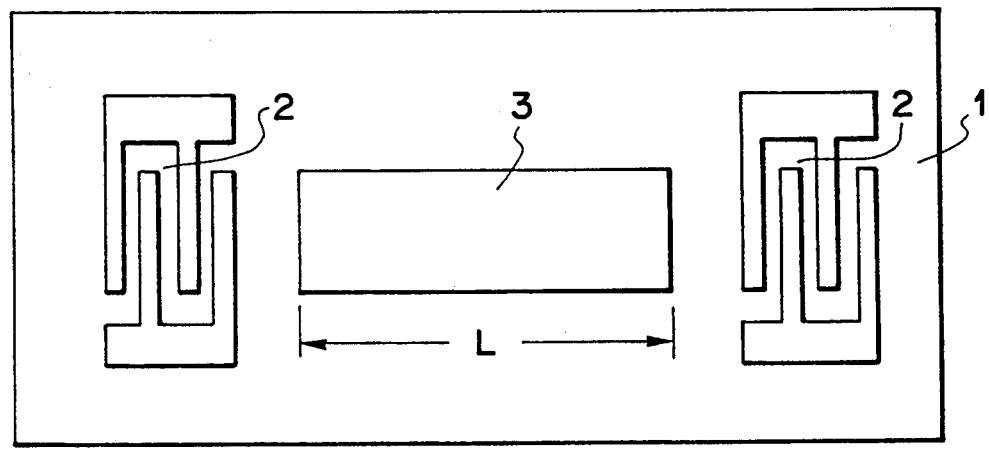
FIGS. 1 and 2 are schematic plan views showing examples of conventional surface acoustic wave devices.
Figure 2:
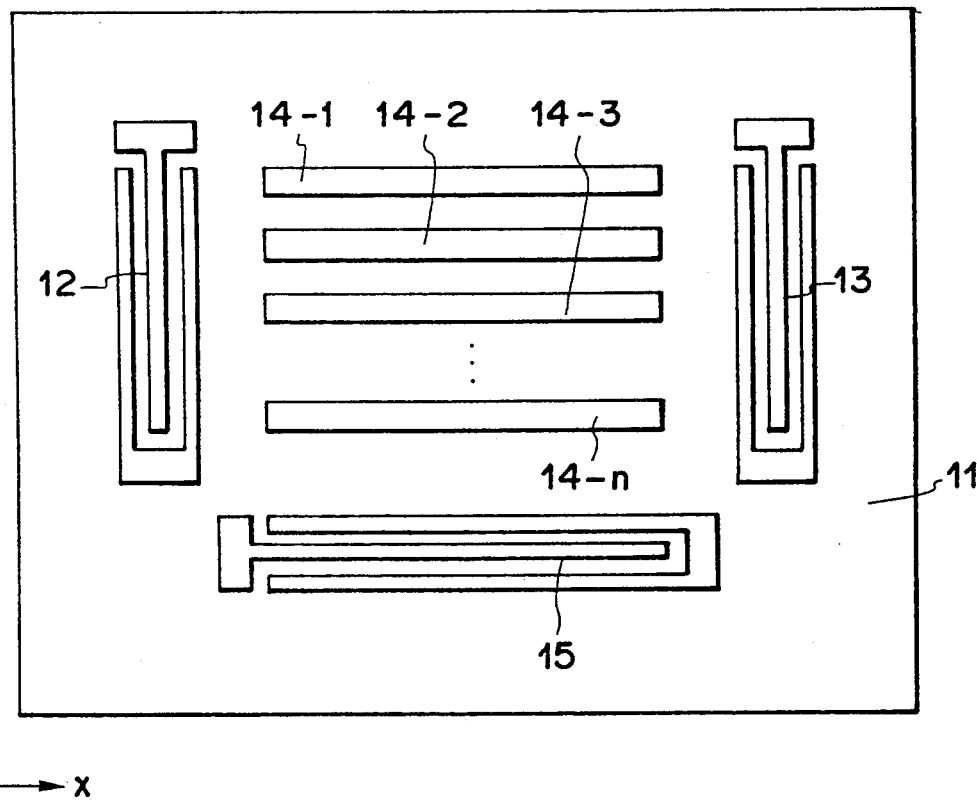
Figure 3:
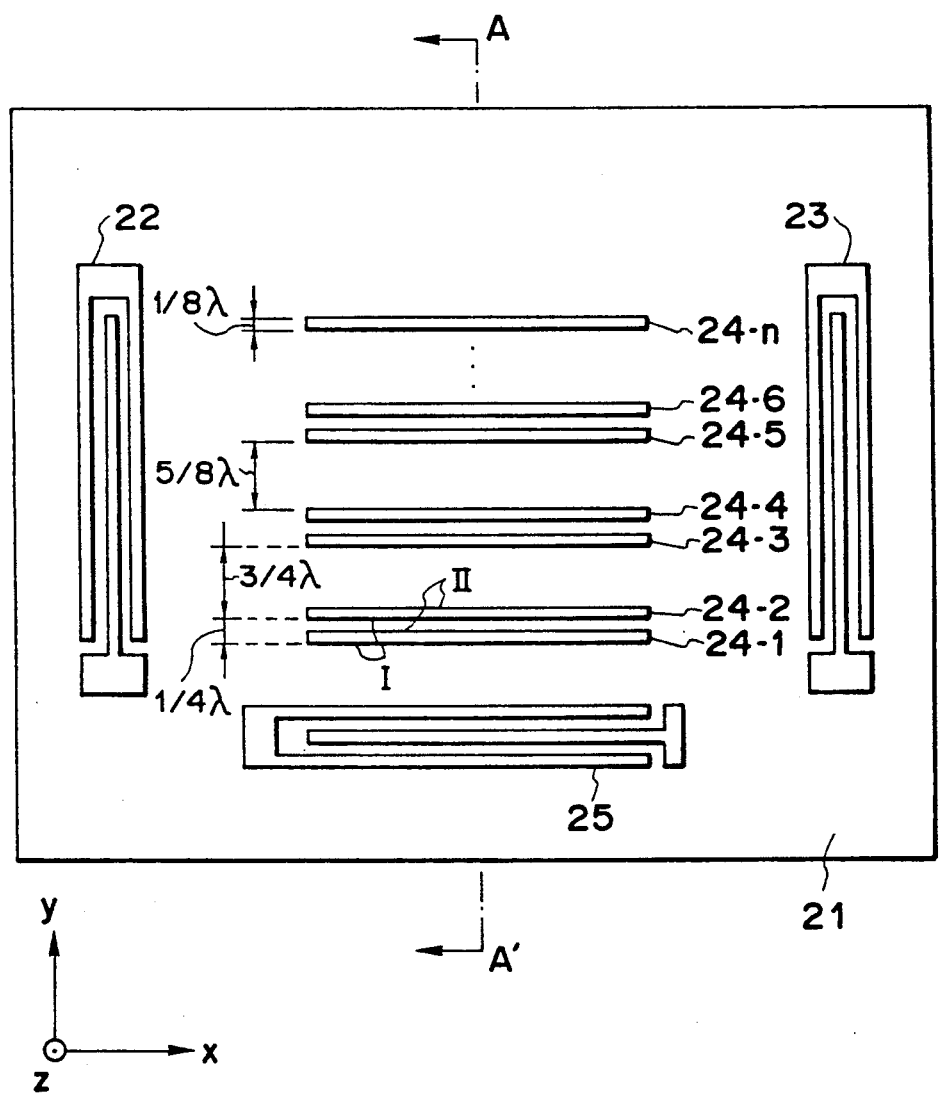
FIG. 3 is a schematic plan view showing a first example of a surface acoustic wave device according to the present invention.
Figure 4:
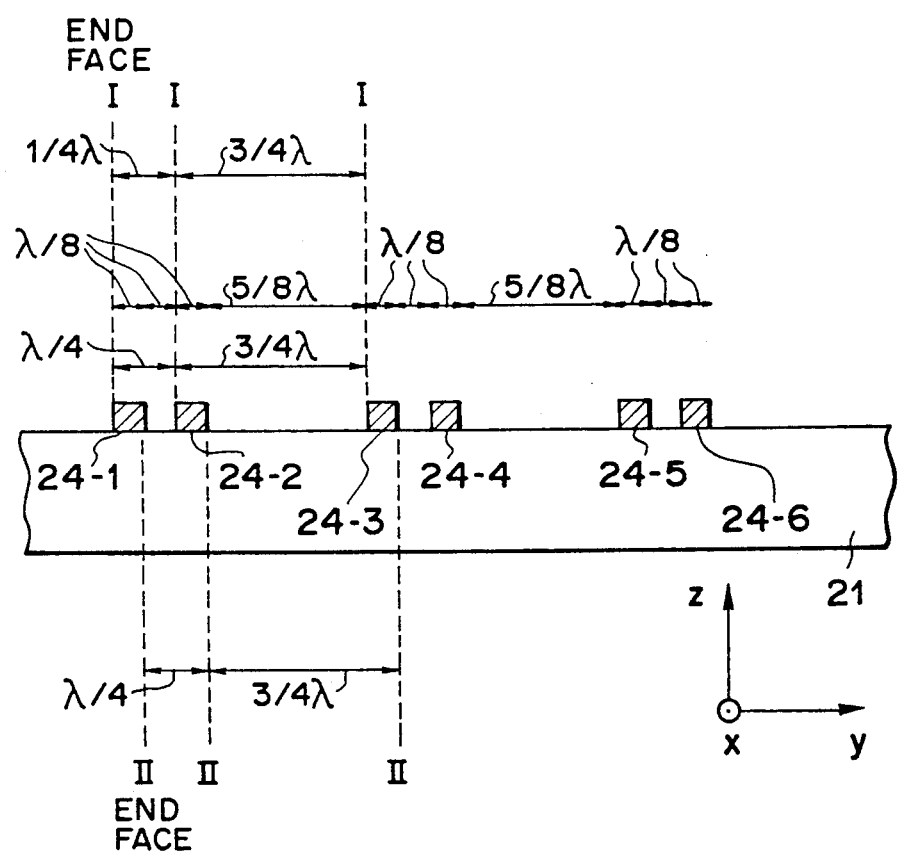
FIG. 4 is a partial cross-sectional view taken along the line A—A' of FIG. 3.

FIG. 3 is a schematic plan view showing a first example of a surface acoustic wave device according to the present invention. FIG. 4 is a schematic cross-sectional view of a portion of the device of FIG. 3 where waveguides are provided, taken along line A—A'.

In FIG. 3, numeral 21 is a piezoelectric substrate, which may be a substrate made of lithium niobate crystal, for example.

Numerals 22, 23 are input interdigital transducers formed on a surface of the substrate 21, respectively, spaced by an appropriate distance and opposed to each other. Each transducers 22, 23 is composed of a comb-type electrode. Such a comb-type electrode is made of an electric conductor such as aluminum, silver, gold, etc., with the photolithography technique. The transducers 22, 23 excite first and second surface acoustic waves propagating in the positive and negative directions of the x axis, respectively.

Numerals 24-1, 24-2, ..., 24-n are waveguides for surface acoustic waves formed between the transducers 22, 23 on the surface of the substrate 21, or on a region where the first and second surface acoustic waves overlap. Those waveguides have a long shape extending in the x direction and arranged in parallel to each other in the y direction. These waveguides are described in detail in "Surface acoustic wave engineering" supervised by Mikio Shibayama, Electronic communications society, pp.82 to 102, wherein there is known a thin film waveguide or topographic waveguide. The present invention is preferably used with $\Delta v/v$ waveguide having the surface of substrate covered with an electric conductor such as aluminum, silver, gold, etc.

Each of the waveguides 24-1 to 24-n produces a third surface acoustic wave propagating in a direction parallel to the y axis, or in a direction orthogonal to the propagating direction of the first and second surface acoustic waves, with the interaction between the first and second surface acoustic waves, as will be described later. Assuming the wavelength of the third surface acoustic wave to be $\lambda$, the width of each waveguide 24-1 to 24-n in the y axis is formed substantially equal to $(\frac{1}{4})\lambda$. Also, these waveguides are arranged periodically with two waveguides as a pair. And the interval between two waveguides making up each pair (the distance between opposed side edges of waveguide) is arranged to be substantially equal to $(\frac{1}{4})\lambda$. For example, in FIG. 3, the intervals between waveguides 24-1 and 24-2, between waveguides 24-3 and 24-4, and between waveguides 24-5 and 24-6 are $(\frac{1}{4})\lambda$, respectively. On the other hand, the interval between each pair is arranged to be $(\frac{3}{8})\lambda$. For Example, in FIG. 3, the intervals between waveguides 24-2 and 24-3, and between waveguides 24-4 and 24-5 are both $(\frac{3}{8})\lambda$.

Thus, the distance between end faces 1 of waveguides 24-1 and 24-2, each being one side edge thereof, is $(\frac{1}{4})\lambda$, and the distance between end faces I of waveguides 24-2 and 24-3 is $(\frac{3}{8})\lambda$, wherein each distance is an odd multiple of $(\frac{1}{4})\lambda$. This is the same for the distance between end faces II.

Numeral 25 is an output interdigital transducer formed on the surface of the substrate 21 and spaced by an appropriate distance in the y direction from the waveguides 24-1 to 24-n. The transducer 25 consists of a comb-type electrode. Such a comb-type electrode is made of an electric conductor such as aluminum, silver, gold, etc., with the photolithographic technology.

In the surface acoustic wave device of this example, if an electric signal with a central angular frequency $\omega$ is input to one input transducer 22, a first surface acoustic wave is excited. The first surface acoustic wave propagates in a positive direction of the x axis to enter the waveguides 24-1, ..., 24-n for surface acoustic wave. Similarly, if an electric signal with a central angular frequency $\omega$ is input to the other input transducer 23, a second surface acoustic wave is excited. The second surface acoustic wave propagates in a negative direction of the x axis to enter the waveguides 24-1 to 24-n. In this way, the first and second surface acoustic waves propagate in opposite directions to each other within the waveguides 24-1 to 24-n. And from the waveguides 24-1 to 24-n, a third surface acoustic wave with a central angular frequency $2\omega$ is produced propagating in the y direction, due to the parametric mixing phenomenon. This third surface acoustic wave corresponds to a convolution signal for signals input respectively into the input transducers 22, 23. The third surface acoustic wave is received by the output transducer 25 and converted into an electric signal.

On the other hand, a part of the third surface acoustic wave may be reflected toward the waveguides 24-1 to 24-n from the output transducer 25. And it is reflected again at side edge (end face) of each waveguide in the y direction. The phase difference between the surface acoustic wave reflected at end face I of the waveguide 24-1 and that reflected at end face I of the waveguide 24-2 is $(\frac{1}{2})\lambda$ in this example, in reverse phase, so that two reflected waves will cancel each other. Similarly, the reflected waves at end faces I of waveguides 24-2 and 24-3, ..., 24-n and 24-(n+1) are all in reverse phase and cancel each other.

Also, at end face II, the reflected waves will cancel similarly.

Therefore, the reflected waves on the waveguide for surface acoustic wave will cancel each other for two waveguides, so that there is no reflected wave on the whole waveguide for surface acoustic wave.

Note that the surface acoustic wave with an angular frequency $2\omega$ excited from the waveguides 24-1 to 24-n for surface acoustic wave can be efficiently excited as in the conventional examples.

While in this example, the interval between the odd number and the next even number waveguides for the surface acoustic wave waveguides 24-1 to 24-n is $(\frac{1}{4})\lambda$, and the interval between the even number and the next odd number waveguides is $(\frac{3}{8})\lambda$, those intervals can be exchanged with each other without problems.

Also, in this example, the number of surface acoustic wave waveguides is even in all, but the same effects can be obtained with an odd number of waveguides in all.

Figure 5:
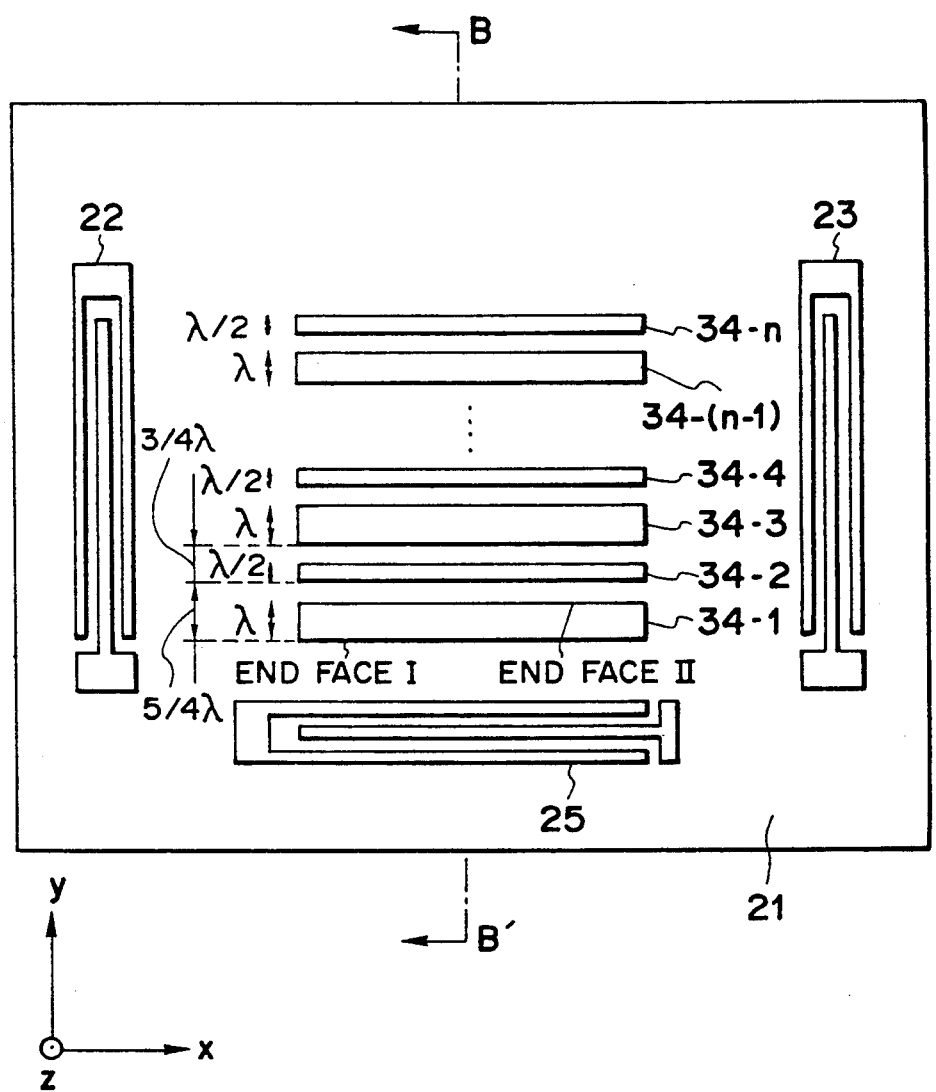
FIG. 5 is a schematic plan view showing a second example of a surface acoustic wave device according to the present invention.
Figure 6:
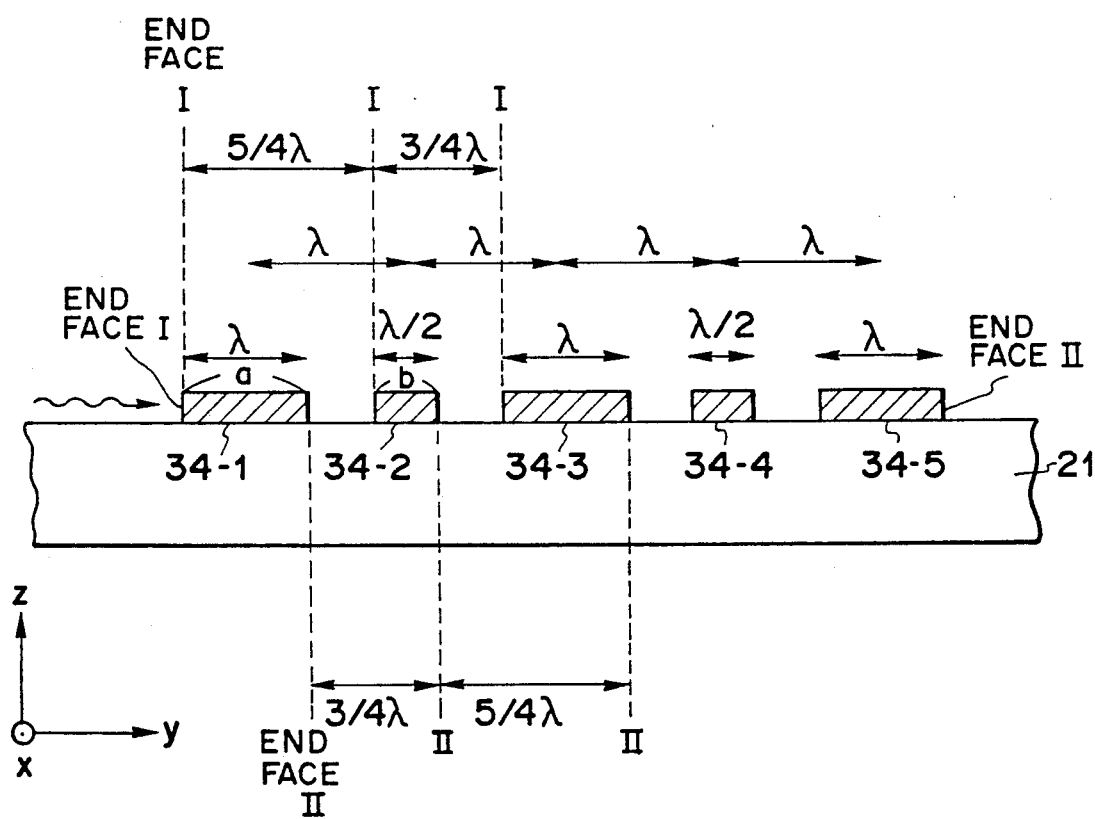
FIG. 6 is a partial cross-sectional view taken along the line B—B' of FIG. 5.

FIG. 5 is a schematic plan view showing a second example of a surface acoustic wave device according to the present invention. FIG. 6 is a schematic cross-sectional view of a portion of the device of FIG. 5 where the waveguides are provided, taken along the line B—B'. In FIGS. 5 and 6, the same numerals are attached to the same parts as in FIGS. 3 and 4, and the detail explanation will be omitted.

This example is constituted in the same way as the first example except that surface acoustic wave waveguides 34-1, 34-2, ..., 34-n are formed between transducers 22 and 23. Each of the waveguides 34-1 to 34-n produces a third surface acoustic wave propagating in a direction parallel to the y axis, or in a direction orthogonal to the propagating direction of the first and second surface acoustic waveguides, with the interaction between the first and second surface acoustic waves, as in the first example. Assuming the wavelength of the third surface acoustic wave to be $\lambda$, the waveguides are arranged so that the distance (pitch) between centers of adjacent waveguides is equal to the wavelength $\lambda$. Also, they are formed so that the width of each waveguide 34-1, 34-3, ..., 34-(n-1) in the y axis direction is equal to $\lambda$. On the other hand, they are formed so that the width of each waveguide 34-2, 34-4, ..., 34-n in the y axis direction is equal to $(\frac{1}{2})\lambda$. That is, in this example, the waveguide having a width $\lambda$ and that having a width $(\frac{1}{2})\lambda$ are alternately arranged at a pitch of $\lambda$. Therefore, the distance between end faces I of waveguides 34-1 and 34-2 is $(5/4)\lambda$, and the distance between end faces I of waveguides 34-2 and 34-3 is $(\frac{3}{4})\lambda$, either of them being equal to an odd multiple of $(\frac{1}{4})\lambda$. Also, the distance between end faces II are equal $(\frac{3}{4})\lambda$ and $(5/4)\lambda$, respectively, each of which is also an odd multiple of $(\frac{1}{4})\lambda$. Therefore, the wave reflected at each end face will overlap in reverse phase, and extinguish.

In this way, when the waveguide are arranged at a fixed pitch which is a whole multiple of $\lambda$, assume the widths of two adjacent waveguides to be a and b. Then if the waveguides are formed to satisfy the following expression, $$a - b = (m + \tfrac{1}{2})\lambda \quad (1)$$

where a>b, and m is 0 or a positive integer, the reflected waves will cancel each other to eliminate the influence upon the output signal. In this example, with $a=\lambda$ and $b=(\frac{1}{2})\lambda$, the above expression (1) can be satisfied.

Note that as the interval (or array pitch) between centers of surface acoustic wave waveguides in the y direction is always $\lambda$, the surface acoustic wave with an angular frequency $2\lambda$ excited from each surface acoustic wave waveguide will all overlap in the same phase, and can be efficiently excited as in the conventional examples.

Figure 7:
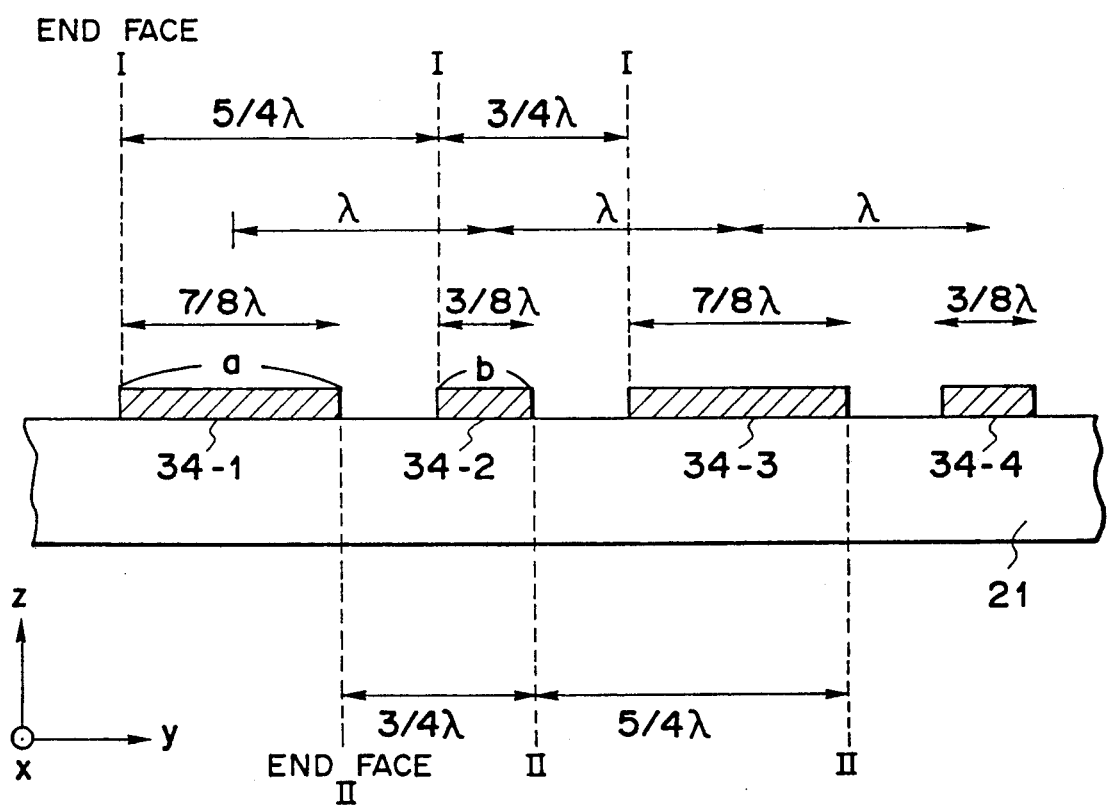
FIGS. 7 to 11 are schematic cross-sectional views showing third to seventh examples of surface acoustic wave devices according to the present invention, respectively.

FIG. 7 is a schematic cross-sectional view showing a third example of the present invention. In this example, the waveguides have different widths from those of the second example. Accordingly, all the portions except for the width of the waveguides are constituted like the device as shown in FIGS. 5 and 6.

In this example, the line width between surface acoustic wave waveguides 34-1, 34-3, ..., is $(\frac{7}{8})\lambda$, and the line width between surface acoustic wave waveguides 34-2, 34-4, ..., is $(\frac{3}{8})\lambda$, with the array pitch of each waveguide being $\lambda$. Therefore, the distance between end faces I of waveguides 34-1 and 34-2 is $(5/4)\lambda$, and the distance between end faces I of waveguides 34-2 and 34-3 is $(\frac{3}{4})\lambda$, either of them being equal to an odd multiple of $(\frac{1}{4})\lambda$. Also, the distance between end faces II are equal to $(\frac{3}{4})\lambda$ and $(5/4)\lambda$, respectively, each of which is also an odd multiple of $(\frac{1}{4})\lambda$. Therefore, the wave reflected at an end face of each waveguide will overlap in reverse phase, and extinguish. In this example, with $a=(\frac{7}{8})\lambda$ and $b=(\frac{3}{8})\lambda$, the expression (1) as previously described can be satisfied.

Figure 8:
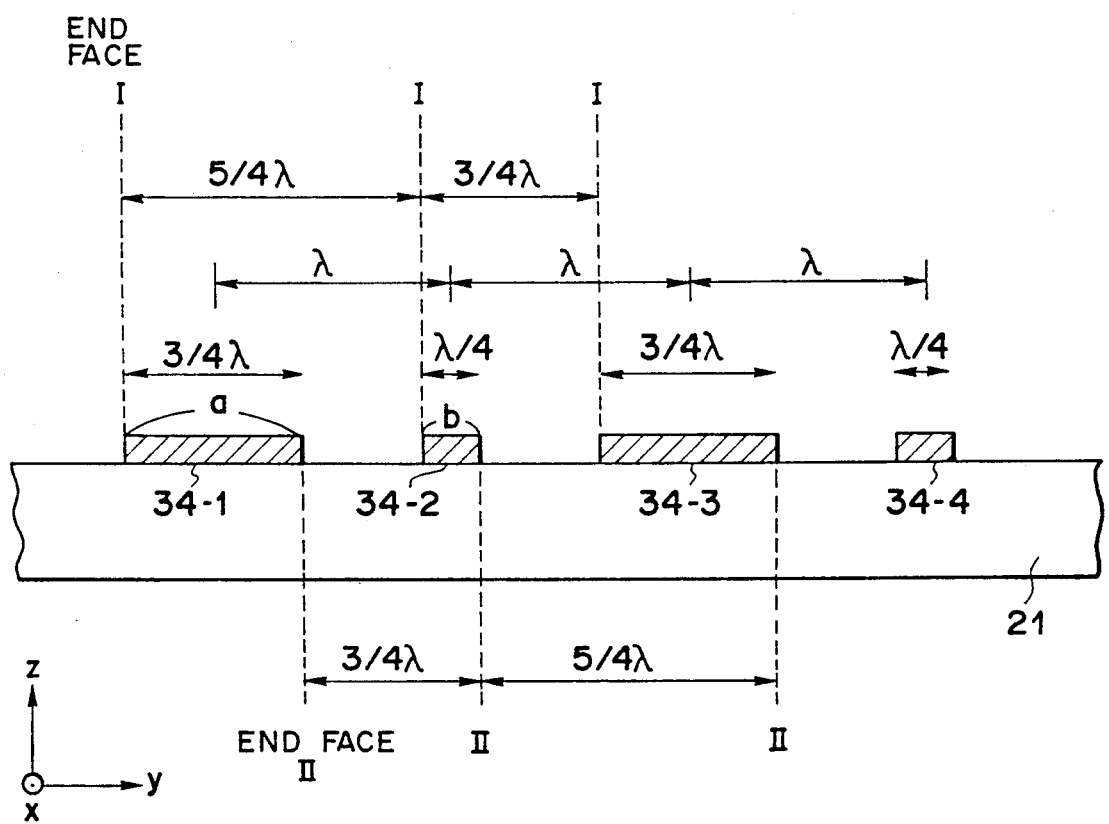

FIG. 8 is a schematic cross-sectional view showing a fourth example of the present invention. In this example, the waveguides have different widths from those of the second example. Accordingly, all the portions except for the width of the waveguide are constituted like the device as shown in FIGS. 5 and 6.

In this example, the line width between surface acoustic wave waveguides 34-1, 34-3, ..., is $(\frac{3}{4})\lambda$, and the line width between surface acoustic wave waveguides 34-2, 34-4, ..., is $(\frac{1}{4})\lambda$, with the array pitch of each waveguide being $\lambda$.

Therefore, the distance between end faces I of waveguides 34-1 and 34-2 is $(5/4)\lambda$, and the distance between end faces I of waveguides 34-2 and 34-3 is $(\frac{3}{4})\lambda$, either of them being equal to an odd multiple of $(\frac{1}{4})\lambda$. Also, the distance between end faces II are equal to $(\frac{3}{4})\lambda$ and $(5/4)\lambda$, respectively, each of which is also an odd multiple of $(\frac{1}{4})\lambda$. Therefore, the wave reflected at an end face of each waveguide will overlap in reverse phase, and extinguish. In this example, with $a=(\frac{3}{4})\lambda$ and $b=(\frac{1}{4})\lambda$, the expression (1) as previously described can be satisfied.

Figure 9:
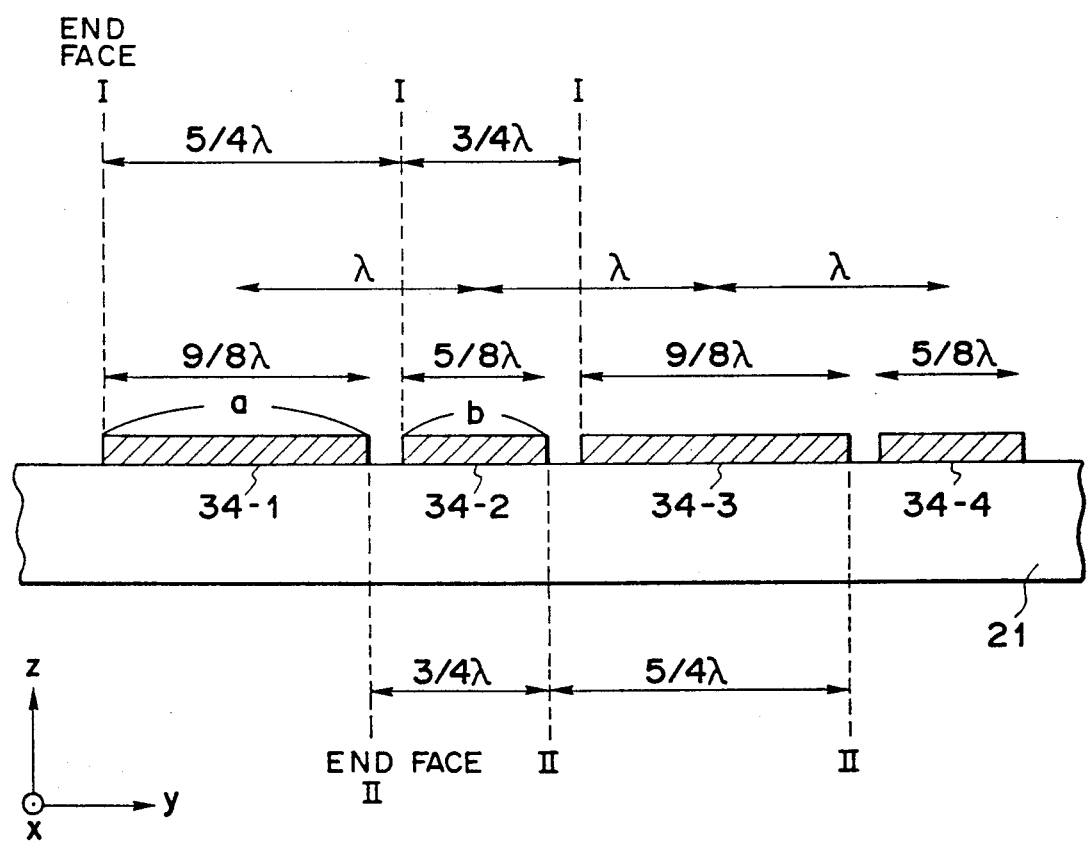

FIG. 9 is a schematic cross-sectional view showing a fifth example of the present invention. In this example, the waveguides have different widths from those of the second example. Accordingly, all the portions except for the width of the waveguide are constituted like the device as shown in FIGS. 5 and 6.

In this example, the line width between surface acoustic wave waveguides 34-1, 34-3, ..., is $(9/8)\lambda$, and the line width between surface acoustic wave waveguides 34-2 34-4, ..., is $(\frac{5}{8})\lambda$, with the array pitch of each waveguide being $\lambda$.

Therefore, the distance between end faces I of waveguides 34-1 and 34-2 is $(5/4)\lambda$, and the distance between end faces I of waveguides 34-2 and 34-3 is $(\frac{3}{4})\lambda$, either of them being equal to an odd multiple of $(\frac{1}{4})\lambda$. Also, the distances between end faces II are equal to $(\frac{3}{4})\lambda$ and $(5/4)\lambda$, respectively, each of which is also an odd multiple of $(\frac{1}{4})\lambda$. Therefore, the wave reflected at an end face of each waveguide will overlap in reverse phase, and extinguish. In this example, with $a=(9/8)\lambda$ and $b=(\frac{5}{8})\lambda$, the expression (1) as previously described can be satisfied.

In addition to the second to fifth examples as above described, if the width of each waveguide is set to satisfy the expression (1), for example, A) $a=(\frac{5}{8})\lambda$, $b=(\frac{1}{8})\lambda$
B) $a=(7/4)\lambda$, $b=(\frac{1}{4})\lambda$ or
C) $a=(13/8)\lambda$, $b=(\frac{1}{8})\lambda$ it is clear that the effect of extinguishing the reflected wave can be obtained.

In the second to fifth examples, the width of an odd numbered waveguide (34-1, 34-3, ...) was a, and that of an even numbered waveguide was b, it is clear that the same effects can be obtained if they are exchanged.

Figure 10:
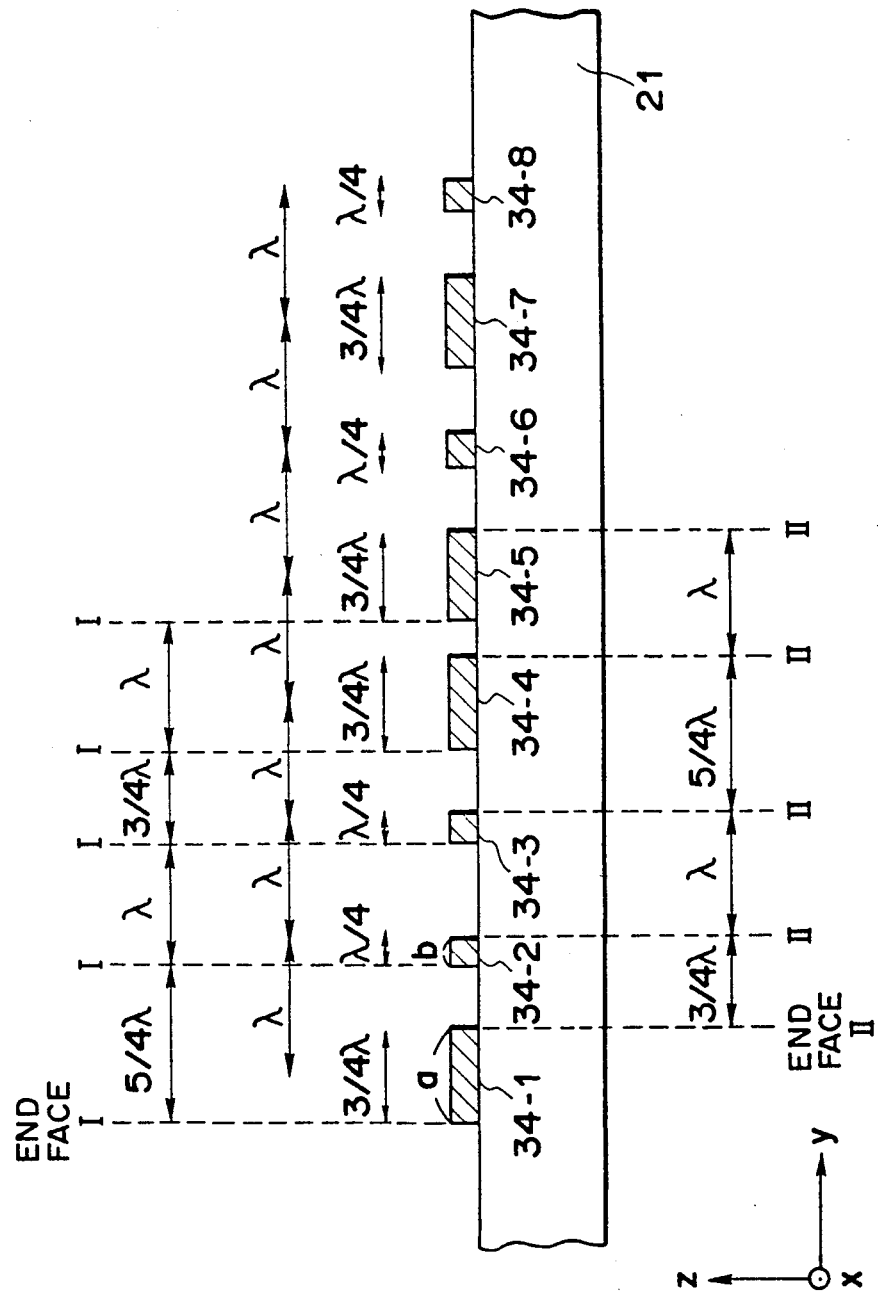

FIG. 10 is a schematic cross-sectional view showing a sixth example of the present invention. In this example, the waveguides have different widths from those of the second example. Accordingly, all the portions except for the width of the waveguides are constituted like the device as shown in FIGS. 5 and 6.

In this example, the surface acoustic wave waveguides are formed such that when they are grouped from the extreme end, with two waveguides having the odd number and the even number (34-1 and 34-2, 34-3 and 34-4, 34-5 and 34-6, ...) as a pair, the width of one waveguide for each group is $(\frac{3}{4})\lambda$, while the width of the other waveguide is $(\frac{1}{4})\lambda$.

Also, the interval pitch between centers of waveguides is formed to be $\lambda$. Note that the waveguide having a width of $(\frac{3}{4})\lambda$ and the waveguide having a width of $(\frac{1}{4})\lambda$ can be arranged in an arbitrary order.

With such a constitution, the reflected waves at end faces for odd numbered and even numbered waveguides (34-1 and 34-2, 34-3 and 34-4, ...) are shifted in phase by $(\frac{1}{2}+m)\lambda$, and thus will cancel.

The distance between end faces I of waveguides 34-1 and 34-2 is $(5/4)\lambda$, and the distance between end faces I of waveguides 34-2 and 34-3 is $(\frac{3}{4})\lambda$, either of them being equal to an odd multiple of $(\frac{1}{4})\lambda$. Also, the distances between end faces II are equal to $(\frac{3}{4})\lambda$ and $(5/4)\lambda$, respectively, each of which is also an odd multiple of $(\frac{1}{4})\lambda$.

Figure 11:
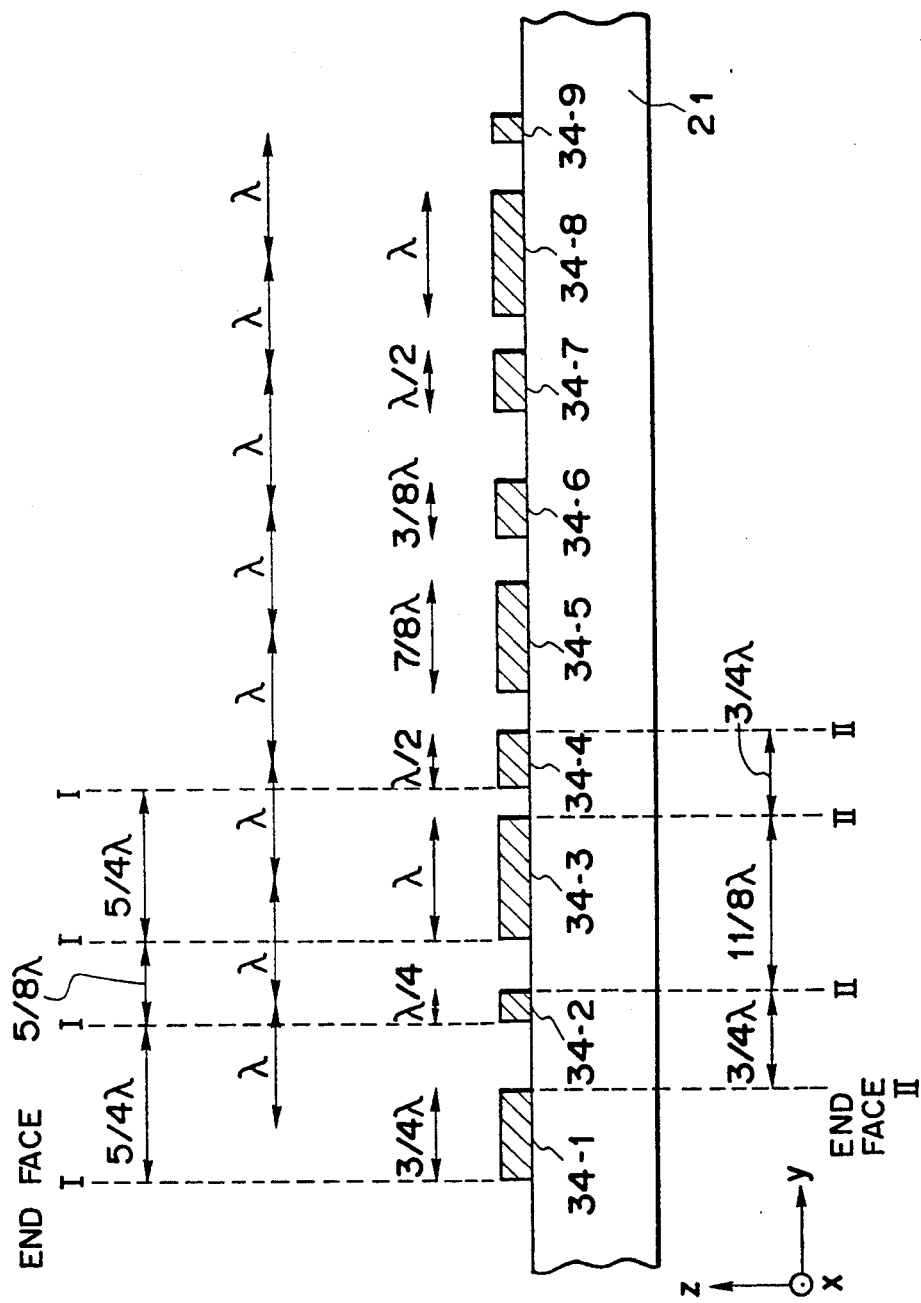

FIG. 11 is a schematic cross-sectional view showing a seventh example of the present invention. In this example, the waveguides have different widths from those of the second example. Accordingly, all the portions except for the width of the waveguides are constituted like the device as shown in FIGS. 5 and 6.

In this example, like the sixth example, when two waveguides are grouped as a pair, the waveguides for each group have different widths. That is, the waveguides are formed such that the width of waveguide 34-1 is $(\frac{3}{4})\lambda$, the width of waveguide 34-2 is $(\frac{1}{4})\lambda$, the width of waveguide 34-3 is $\lambda$, the width of waveguide 34-4 is $(\frac{1}{2})\lambda$, the width of waveguide 34-5 is $(\frac{7}{8})\lambda$, the width of waveguide 34-6 is $(\frac{3}{8})\lambda$, the width of waveguide 34-7 is $(\frac{1}{2})\lambda$, the width of waveguide 34-8 is $\lambda$ and so on. Also, the array pitch of each waveguide is formed to be equal to $\lambda$.

In this example, the distance between end faces I of waveguides 34-1 and 34-2 and the distance between end faces I of waveguides 34-3 and 34-4 are both $(5/4)\lambda$, which is equal to an odd multiple of a quarter wavelength of the third surface acoustic wave. Also, the distance between end faces II of waveguides 34-1 and 34-2 and the distance between end faces II of waveguides 34-3 and 34-4 are both $(\frac{3}{4})\lambda$, which is equal to an odd multiple of $(\frac{1}{4})\lambda$. Therefore, the waves reflected from two waveguides for each group will cancel each other. In this way, if with two waveguides as a pair, the difference between the widths of two waveguides making up each group satisfies the expression (1) as previously shown, the previously-mentioned effects of the present invention can be obtained even if the waveguides have different widths depending on each group.

Figure 12:
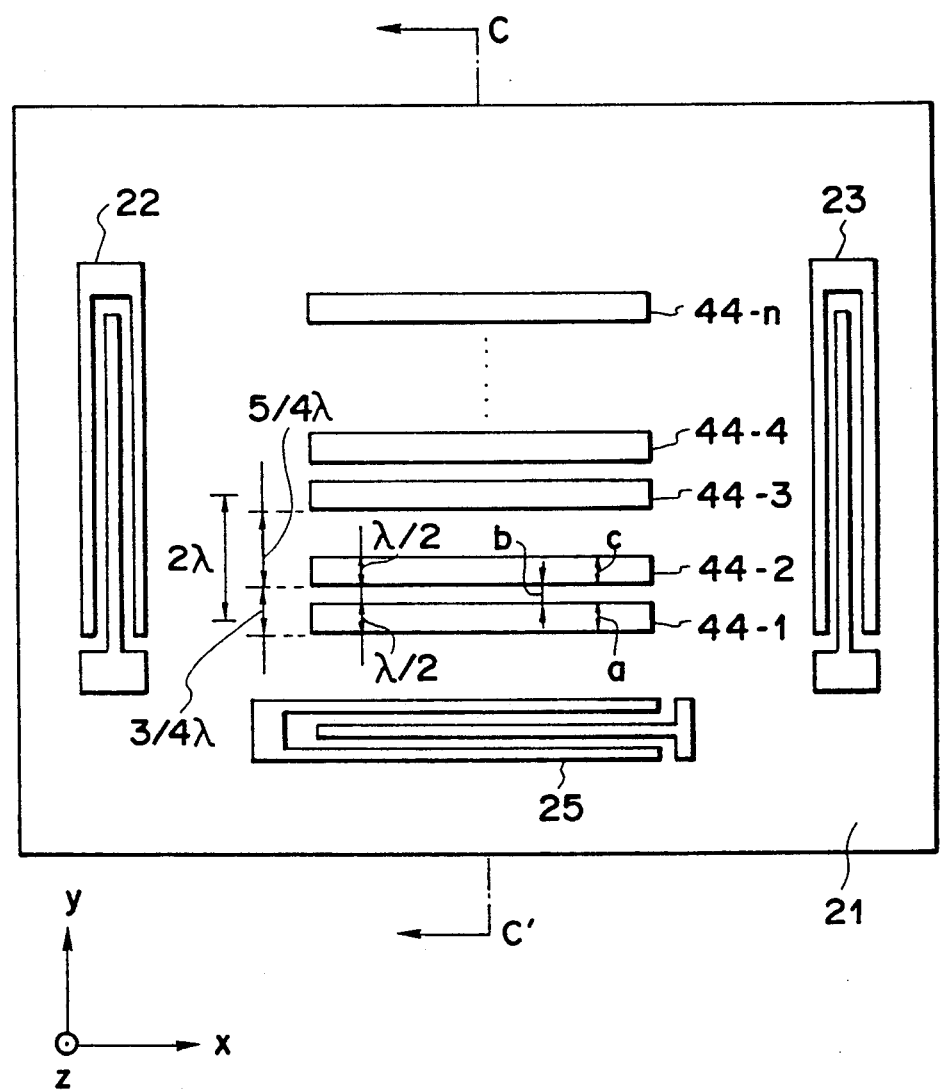
FIG. 12 is a schematic plan view showing an eighth example of a surface acoustic wave device according to the present invention.
Figure 13:
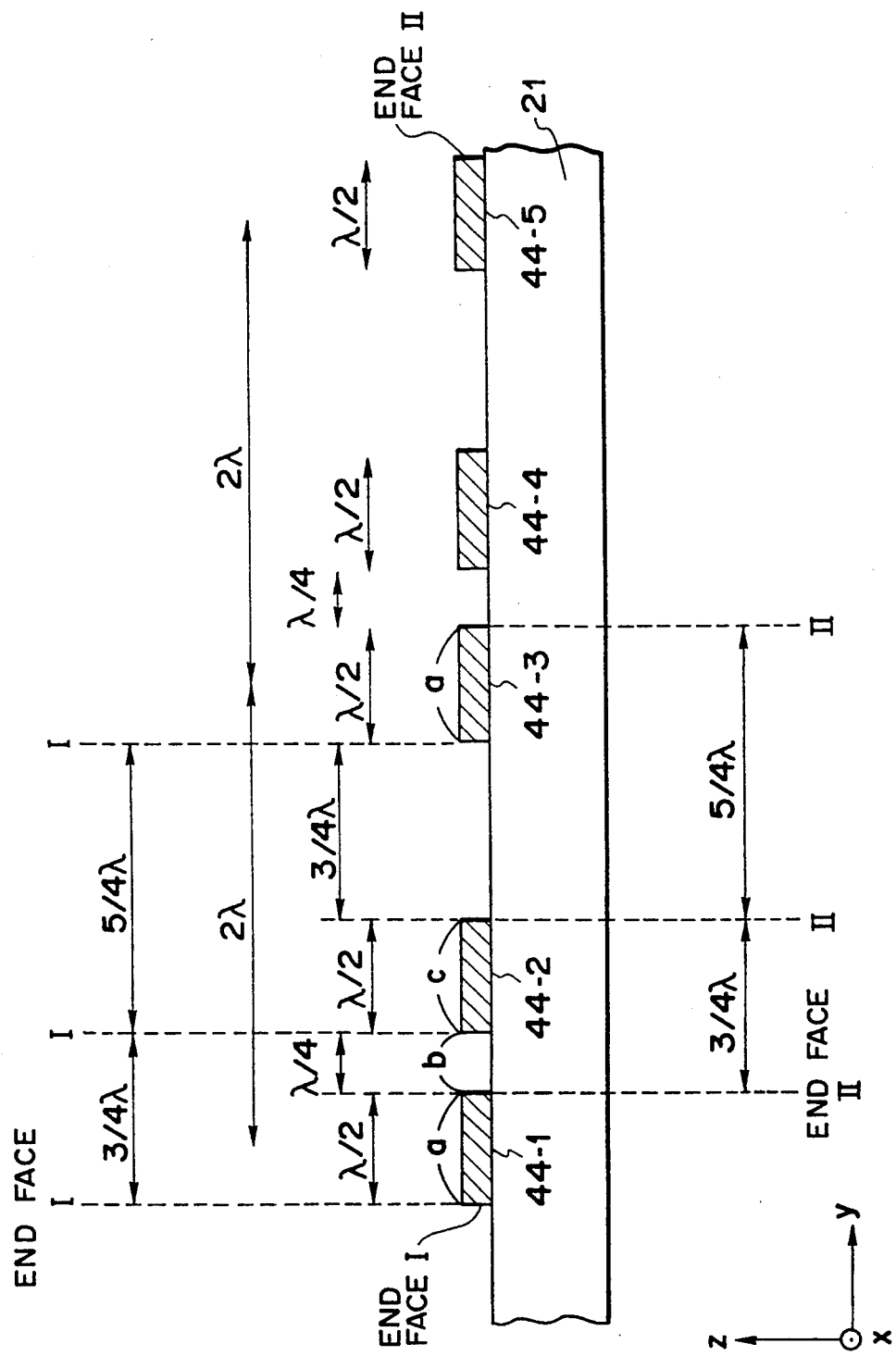
FIG. 13 is a partial cross-sectional view taken along the line C—C' of FIG. 12.

FIG. 12 is a schematic cross-sectional view showing an eighth example of a surface acoustic wave device according to the present invention. FIG. 13 is a schematic cross-sectional view of a portion of the device of FIG. 12 where the waveguides are provided, taken along the line C—C'. In FIGS. 12 and 13, the same numerals are attached to the same parts as in FIGS. 3 and 4, and the detailed explanation will be omitted.

This example is one in which two waveguides are grouped as a pair and such pairs are arranged at a pitch of $2\lambda$. Each pair is made up of the first waveguide 44-1, 44-3, ... and the second waveguide 44-2, 44-4, .... The widths of the first and second waveguides are both $(\frac{1}{2})\lambda$. Also, the interval between the first and second waveguides (distance between opposed end faces of two waveguides) for each pair is formed to be $(\frac{1}{4})\lambda$. The interval between the second waveguide for each pair and the first waveguide for the next pair is formed to be $(\frac{3}{4})\lambda$.

With the above constitution, the distance between end face I of waveguide 44-1 and end face I of waveguide 44-2 is $(\frac{3}{4})\lambda$ and the distance between end face I of waveguide 44-2 and end face I of waveguide 44-3 is $(5/4)\lambda$ in this example. Also, similarly with the end face II, the distances between end faces are $(\frac{3}{4})\lambda$ and $(5/4)\lambda$, respectively. In this way, the distance between end faces is an odd multiple of $(\frac{1}{4})\lambda$ in all cases, wherein the reflected waves will be synthesized in reverse phase and extinguish.

In this way, when two waveguides are grouped as a pair and those pairs are arranged at a pitch of $2\lambda$, assume that the width of the first waveguide for each pair is a, the interval between two waveguides making up each pair is b and the width of the second waveguide for each pair is c. Then if the waveguides are constituted to satisfy the following conditional expression, $$a+b=\frac{1}{2}(m+\frac{1}{2})\lambda \quad (2)$$

$$b+c=\frac{1}{2}(n+\frac{1}{2})\lambda \quad (3)$$

the reflected waves will cancel so that the influence upon the output signal can be suppressed. Where is the wavelength of the third surface acoustic wave excited from the waveguide, and m and n are integers. In this example, with $a=(\frac{1}{2})\lambda$, $b=(\frac{1}{4})\lambda$ and $c=(\frac{1}{2})\lambda$, the relations (2) and (3) can be satisfied.

Note that in the propagating direction (y axis direction) of the third surface acoustic wave, the pitch for the first waveguide for each pair is $2\lambda$, which is a whole multiple of the wavelength of the third surface acoustic wave, so that the surface acoustic wave excited from the first waveguide may overlap in phase, and the third surface acoustic wave can be efficiently generated.

Figure 14:
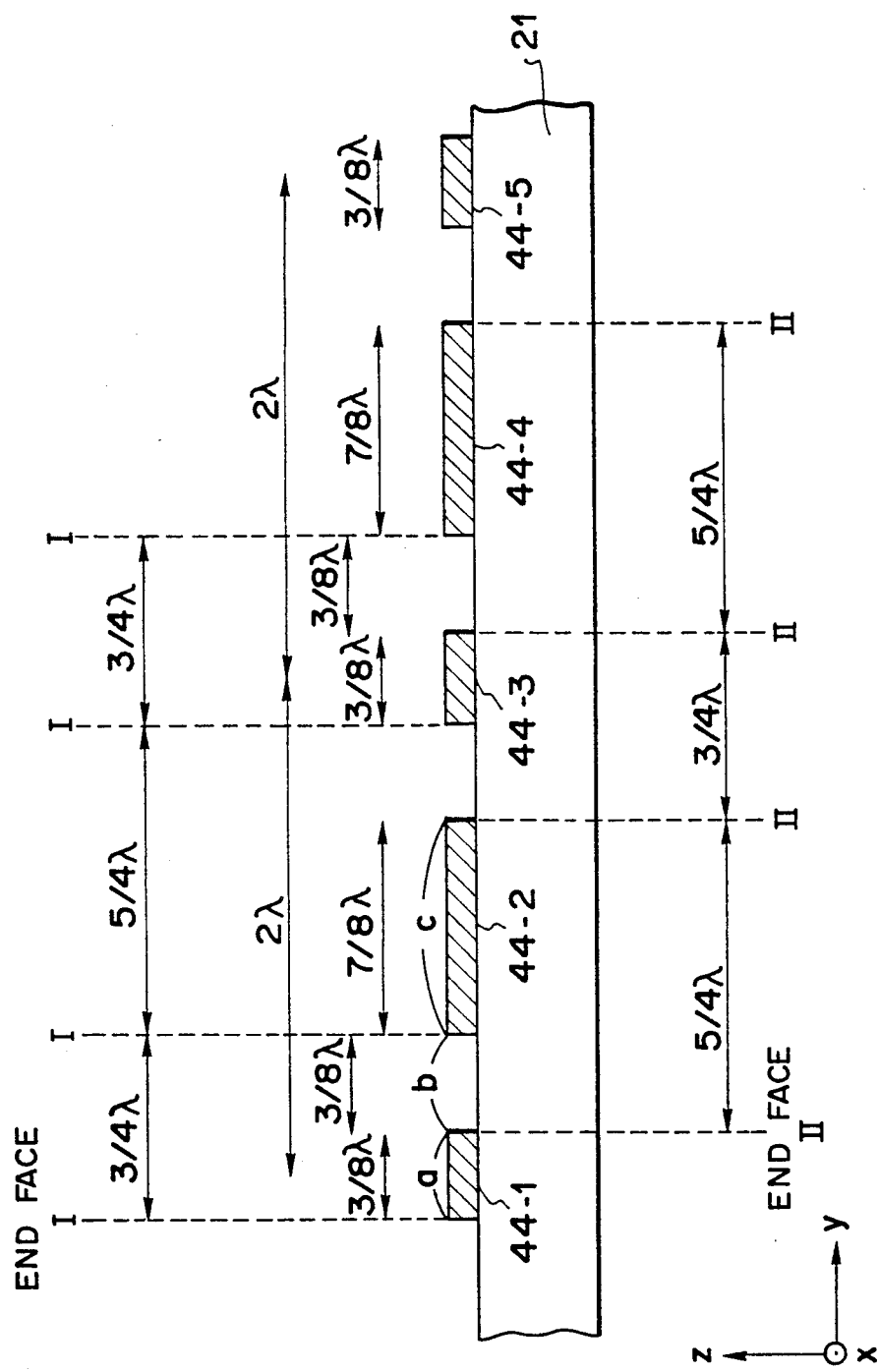
FIGS. 14 and 15 are schematic cross-sectional views showing ninth and tenth examples of surface acoustic wave devices according to the present invention, respectively.

FIG. 14 is a schematic cross-sectional view showing a ninth example of the present invention. This example is one in which the width of waveguide of FIG. 8 is varied. Accordingly, other portions except for the width of the waveguide are constituted in the same way as the device shown in FIGS. 12 and 13.

In this example, when two waveguides are grouped as a pair, the width of the first waveguide 44-1, 44-3, 44-5, ... for each pair is $(\frac{3}{8})\lambda$ and the width of the second waveguides 44-2, 44-4, ... for each pair is $(\frac{5}{8})\lambda$. Also, the interval between two waveguides making up each pair, or the interval between waveguides 44-1 and 44-2, or between waveguides 44-3 and 44-4, is made $(\frac{3}{8})\lambda$, and the interval between the second waveguide for each pair and the first waveguide for the next pair, or the interval between waveguides 44-2 and 44-3, or between waveguides 44-4 and 44-5, is made $(\frac{3}{8})\lambda$.

With the above constitution, in this example, the distance between end face I of waveguide 44-1 and end face I of waveguide 44-2 is $(\frac{3}{4})\lambda$ and the distance between end face I of waveguide 44-2 and end face I of waveguide 44-3 is $(5/4)\lambda$. Also, similarly with the end face II, the distances between end faces are $(5/4)\lambda$ and $(\frac{3}{4})\lambda$, respectively. In this way, the distance between end faces is an odd multiple of $(\frac{1}{4})\lambda$ in all cases, wherein the reflected waves are synthesized in reverse phase and extinguish.

In this example, with $a=(\frac{3}{8})\lambda$, $b=(\frac{3}{8})\lambda$ and $c=(\frac{5}{8})\lambda$, the relations (2) and (3) as previously described can be satisfied.

Figure 15:
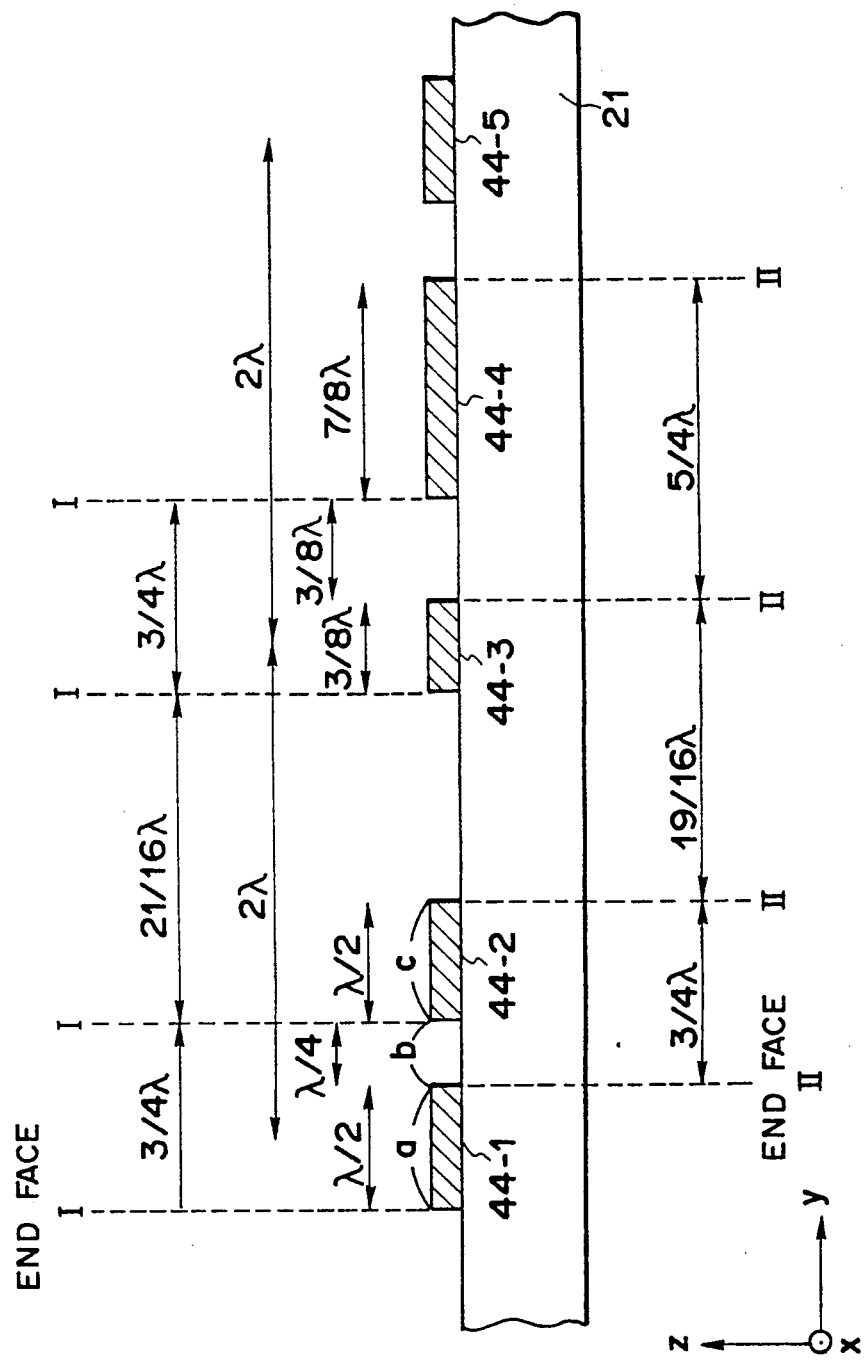

FIG. 15 is a schematic cross-sectional view showing a tenth example of the present invention. This example is one in which the width of the waveguide in the eighth example is varied. Accordingly, all the portions except for the width of the waveguide are constituted like the device as shown in FIGS. 12 and 13.

In this example, the waveguides are formed such that the width of waveguide 44-1 is $(\frac{1}{4})\lambda$, the width of waveguide 44-2 is $(\frac{1}{2})\lambda$, the width of waveguide 44-3 is $(\frac{3}{8})\lambda$, the width of waveguide 44-4 is $(\frac{3}{8})\lambda$, the interval between waveguide 44-1 and waveguide 44-2 is $(\frac{1}{2})\lambda$, and the interval between waveguide 44-3 and waveguide 44-4 is $(\frac{3}{8})\lambda$. Also, the array pitch of each pair of waveguides is equal to $2\lambda$. That is, this example is one in which each pair of waveguides have different widths and intervals therebetween.

With the above constitution, the distance between end faces I of waveguides 44-1 and 44-2 and the distance between end faces I of waveguides 44-3 and 44-4 are both $(\frac{3}{4})\lambda$. Also, with end face II, the distances between end faces are $(\frac{3}{4})\lambda$ and $(5/4)\lambda$, respectively. In this way, the distance between end faces is an odd multiple of $(\frac{1}{4})\lambda$ in all cases, wherein the reflected waves are synthesized in reverse phase and extinguish.

In this example, a first pair of the waveguides has $a=(\frac{1}{4})\lambda$, $b=(\frac{1}{2})\lambda$ and $c=(\frac{1}{4})\lambda$, satisfying the expressions (2) and (3) as previously described. Also, a second pair of the waveguides also has $a=(\frac{3}{8})\lambda$, $b=(\frac{3}{8})\lambda$ and $c=(\frac{3}{8})\lambda$, satisfying the expressions (2) and (3) as previously described. In this way, if two waveguides making up each pair satisfy the relation as represented by the expressions (2) and (3), the effects of the present invention as described can be obtained even if each pair of waveguides have different widths and interval between waveguides.

While in the above examples the surface acoustic wave reflected at an end face of each waveguide is configured to have the reverse phase, the same effects as in the above examples can be obtained even if the distance between end faces of waveguides may be random. This example is explained with reference to FIG. 16.

Figure 16:
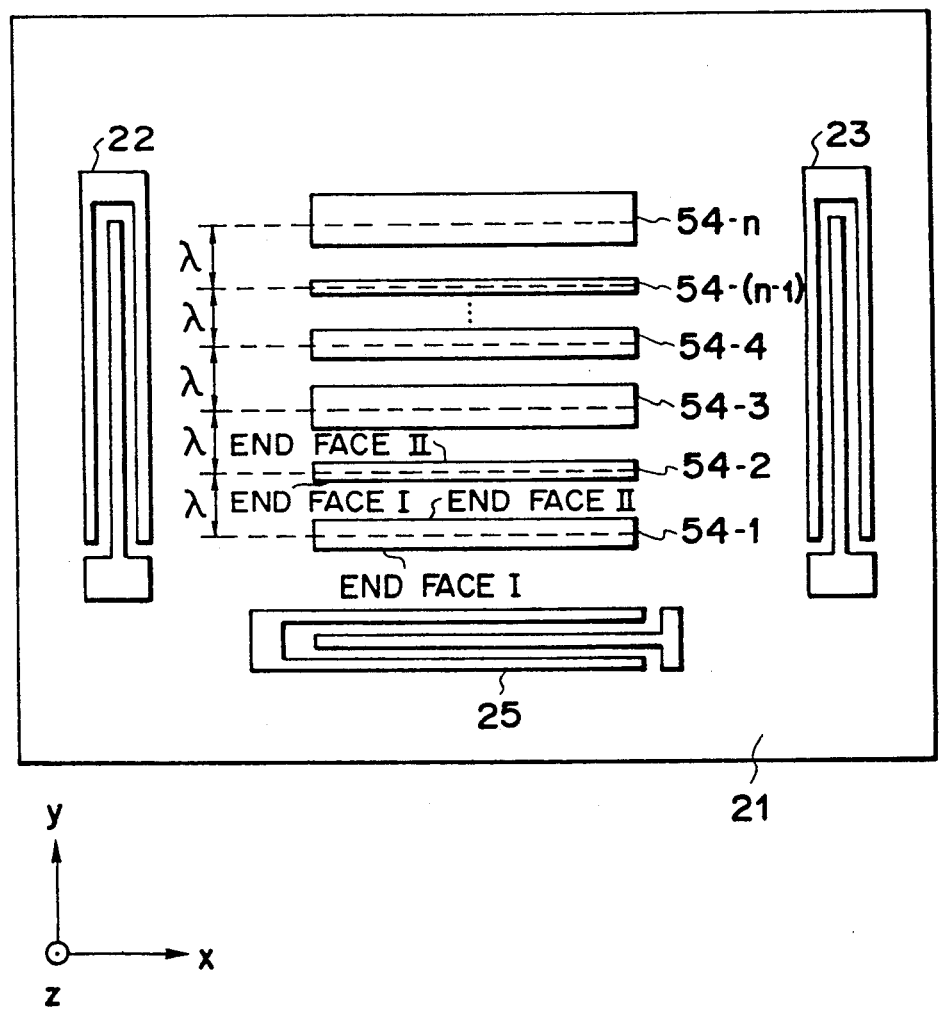
FIGS. 16 to 20 are schematic cross-sectional views showing eleventh to fifteenth examples of surface acoustic wave devices according to the present invention, respectively.

FIG. 16 is a schematic plan view showing an eleventh example of a surface acoustic wave device according to the present invention. In FIG. 16, the same numerals are attached to the same parts as in FIG. 3, and the detail explanation will be omitted.

This example is constituted in the same way as the first example except that surface acoustic wave waveguides 54-1, 54-2, ..., 54-n are formed between transducers 22 and 23. Each of the waveguides 54-1 to 54-n produces a third surface acoustic wave propagating in a direction parallel to the y axis, or in a direction orthogonal to the propagating direction of first and second surface acoustic waveguides, with the interaction between the first and second surface acoustic waves, as in the first example. Assuming the wavelength of the third surface acoustic wave to be $\lambda$, the waveguides are arranged so that the distance (pitch) between centers of adjacent waveguides is equal to the wavelength $\lambda$. Also, they are formed so that the width of each waveguide 54-1, ..., 54-n may be quite random.

With such a constitution, the interval between side edges (end faces) I of waveguides on one side thereof in the y axis direction may be random over the waveguides 54-1 to 54-n. Accordingly, surface acoustic waves reflected at end faces of waveguides may overlap in various phases and cancel as a whole, so that the reflected waves on the entire waveguide may have almost no influence on the third surface acoustic wave. Note that as the array pitch of each waveguide is equal to be $\lambda$, the surface acoustic wave excited from each waveguide may overlap in phase to be intensified with each other. Thus the third surface acoustic wave can be efficiently excited as in the conventional examples.

While in the above-described example, the surface acoustic waves reflected from different waveguides cancel each other, each waveguide may be divided into a plurality of regions, in each of which the reflected waves will cancel. This example will be described in the following.

Figure 17:
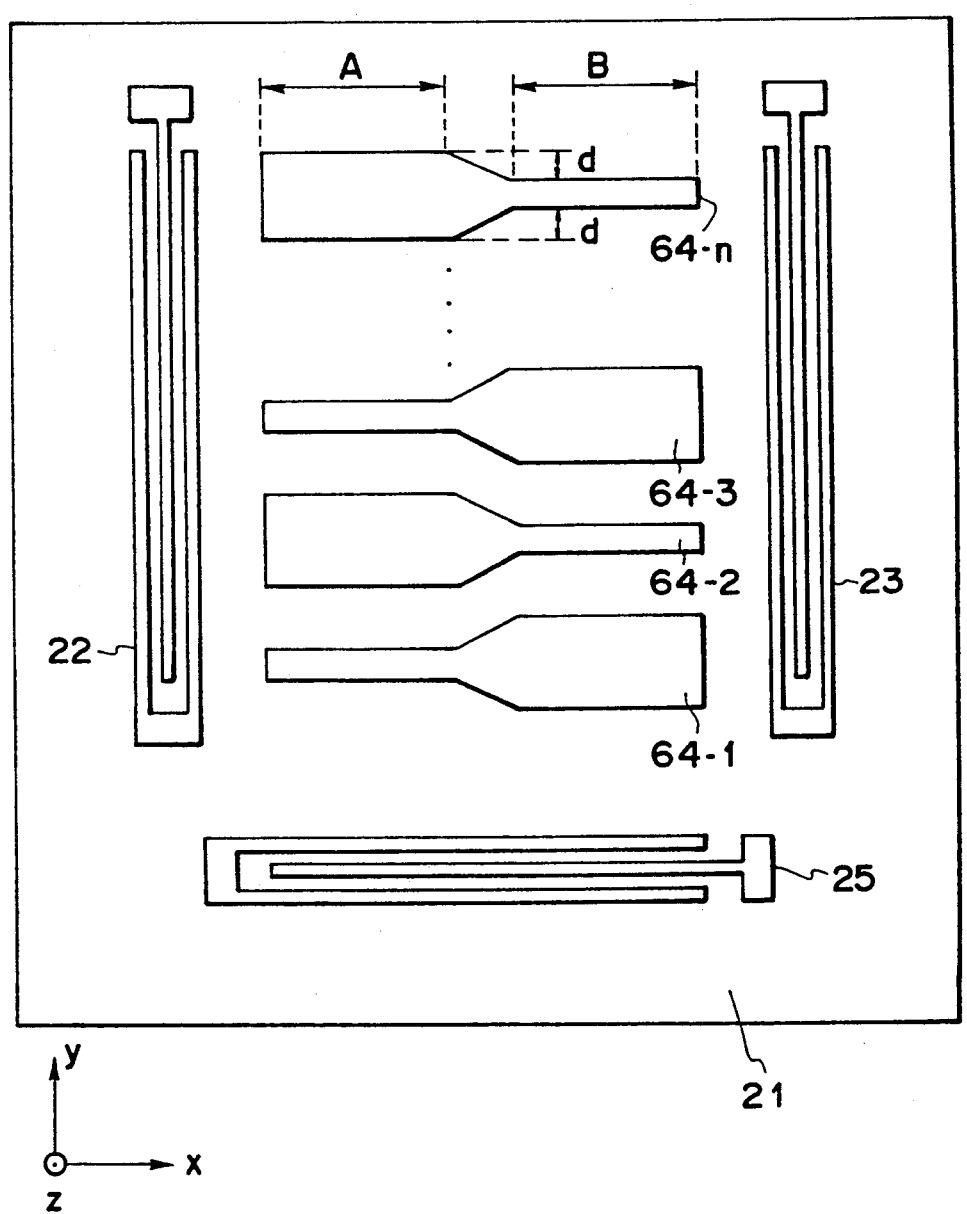

FIG. 17 is a schematic plan view showing a twelfth example of a surface acoustic wave device according to the present invention. In FIG. 17, the same numerals are attached to the same parts as in FIG. 3, and the detailed explanation will be omitted.

This example is constituted in the same way as the first example except that surface acoustic wave waveguides 64-1, 64-2, ..., 64-n are formed between transducers 22 and 23. Each of the waveguides 64-1 to 64-n produces a third surface acoustic wave propagating in a direction parallel to the y axis, or in a direction orthogonal to the propagating direction of first and second surface acoustic waveguides, with the interaction between the first and second surface acoustic waves, as in the first example. The third surface acoustic wave is picked up after conversion into an electric signal with an output transducer 25. Assuming the wavelength of the third surface acoustic wave to be $\lambda$, the waveguides are arranged so that the array pitch of those waveguides is equal to the wavelength $\lambda$.

Also, each waveguide 64-1 to 64-n is divided into two regions of A and B in the propagating direction of the first and second surface acoustic waves, or in the x axis direction. And both side edges (end faces) for each region have a step d of $(\frac{1}{4})\lambda$ in the propagating direction of the third surface acoustic wave, or in the y axis direction.

With such a constitution, the device of this example has a phase difference of $(\frac{1}{2})\lambda$ between the wave reflected at the region A and the wave reflected at the region B for each region. In other words, these reflected waves are in reverse phase. Accordingly, when these reflected waves enter the output transducer 25, the signals converted from the reflected waves electrically cancel each other, having no influence upon the signal converted from the third surface acoustic wave. Note that as the array pitch of waveguides is equal to be $\lambda$, the surface acoustic waves excited from the waveguides may overlap in phase to be intensified with each other. Thus the third surface acoustic wave can be efficiently excited as in the conventional example.

In this example, a wider portion and a narrower portion for the waveguide are alternately arranged in the y axis direction, but they can be randomly arranged. Or the wider portion can be always arranged in either of region A or region B.

Figure 18:
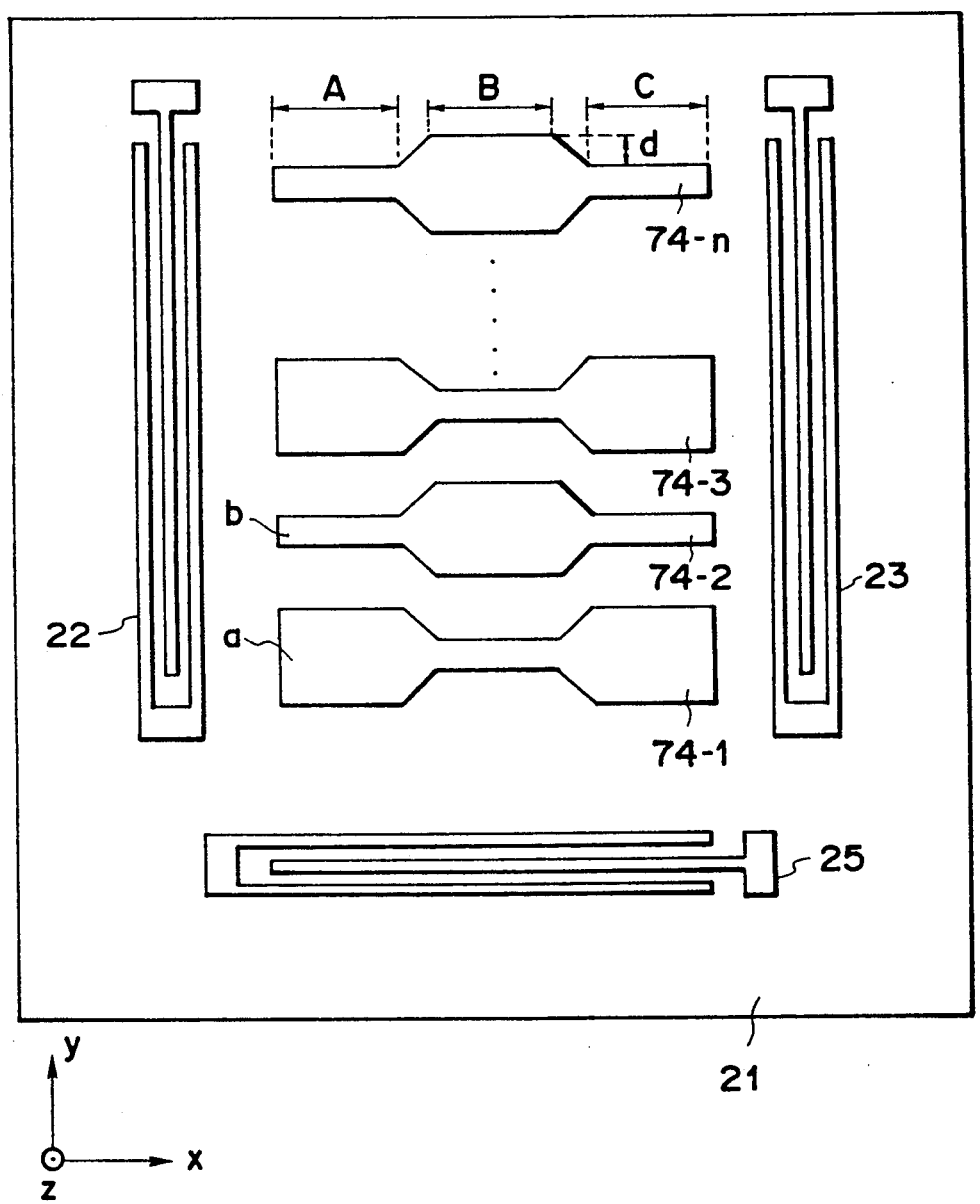

FIG. 18 is a schematic plan view showing a thirteenth example of a surface acoustic wave device according to the present invention. In FIG. 18, the same numerals are attached to the same parts as in FIG. 3, and the detailed explanation will be omitted.

This example is constituted in the same way as the first example except that surface acoustic wave waveguides 74-1, 74-2, ..., 74-n are formed between transducers 22 and 23. Each of the waveguides 74-1 to 74-n produces a third surface acoustic wave propagating in a direction parallel to the y axis, or in a direction orthogonal to the propagating direction of first and second surface acoustic waveguides, with the interaction between the first and second surface acoustic waves, as in the first example. The third surface acoustic wave is picked up after conversion into an electric signal with an output transducer 25. Assuming the wavelength of the third surface acoustic wave to be λ, the waveguides are arranged so that the array pitch of those waveguides is equal to the wavelength λ.

Also, each waveguide 74-1 to 74-n is divided into three regions of region A, region B and region C in the propagating direction of the first and second surface acoustic waves, or in the x axis direction. And the regions A and C and the region B have different widths of waveguide. The step d of end face between regions is formed to be equal to (¼)λ. Thus, the waveguides 74-1 to 74-n are made up of the a-type waveguides 74-1, 74-3, . . . having the concave shape, and the b-type waveguides 74-2, . . . , 74-n having the convex shape.

In this example, the waves reflected at the regions A and C and the wave reflected at the region B for each waveguide become in reverse phase, so that these reflected waves electrically cancel after entering the output transducer 25, thus having no influence upon the signal of the third surface acoustic wave.

While in this example, the a-type waveguide and the b-type waveguide are alternately arranged, they can be randomly arranged. Or the same effects can be obtained even if all the waveguides are constituted of either the a-type or the b-type.

Figure 19:
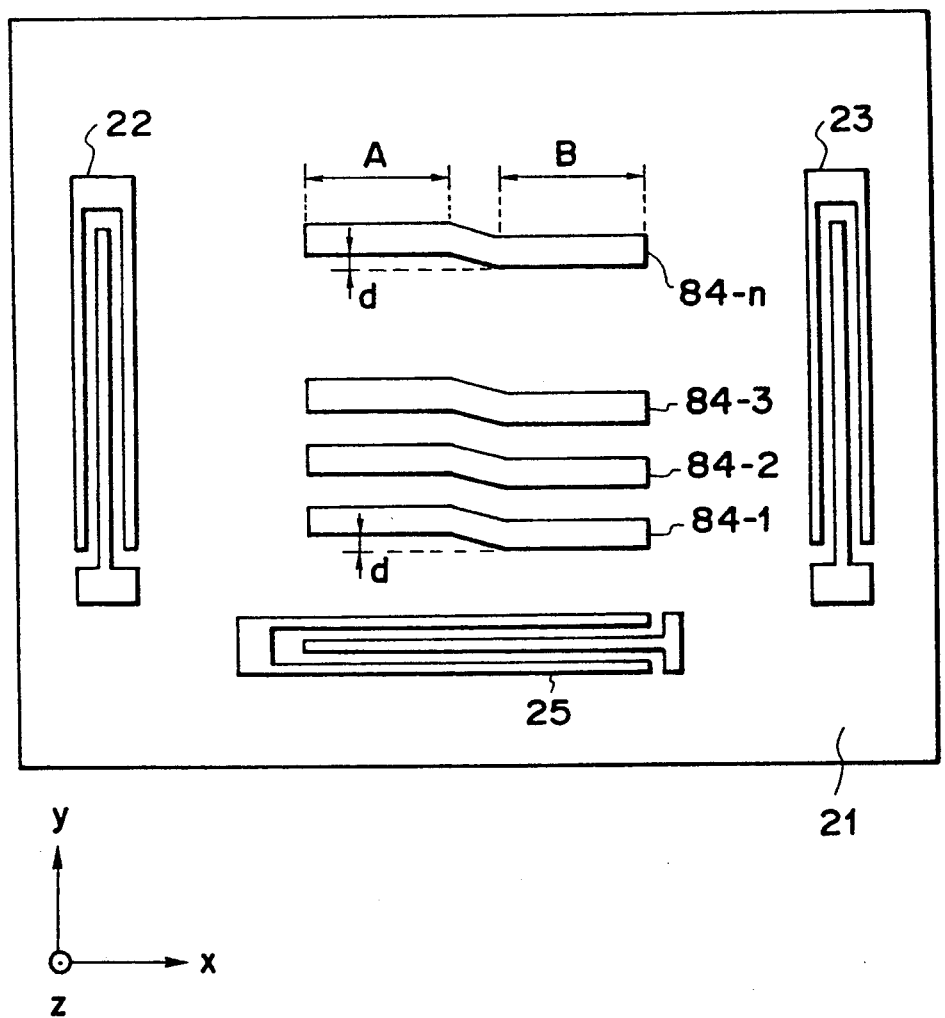

FIG. 19 is a schematic plan view showing a fourteenth example of a surface acoustic wave device according to the present invention. In FIG. 19, the same numerals are attached to the same parts as in FIG. 3, and the detailed explanation will be omitted.

This example is constituted in the same way as the first example except that surface acoustic wave waveguides 84-1, 84-2, . . . , 84-n are formed between transducers 22 and 23. Each of the waveguides 84-1 to 84-n produces a third surface acoustic wave propagating in a direction parallel to the y axis, or in a direction orthogonal to the propagating direction of first and second surface acoustic waveguides, with the interaction between the first and second surface acoustic waves, as in the first example. The third surface acoustic wave is picked up after conversion into an electric signal with an output transducer 25. Assuming the wavelength of the third surface acoustic wave to be λ, the waveguides are arranged so that the array pitch of those waveguides is equal to the wavelength λ.

Also, each waveguide 84-1 to 84-n is divided into two regions of region A and region B in the propagating direction of the first and second surface acoustic waves, or in the x axis direction. Each waveguide has a uniform width but has a flexed shape between the regions A and B. Here, the step d of end face between the regions is formed to be equal to (¼)λ.

In this example, the wave reflected at the region A and the wave reflected at region B for each waveguide are in reverse phase, so that they electrically cancel each other, having no influence upon the signal from the third surface acoustic wave.

While in the twelfth to fourteenth examples as previously described, the step d of end face of waveguide was formed to be equal to (¼)λ, in general, the same effects as in those examples can be obtained if the step d is formed to satisfy the following conditional expression $$d = \tfrac{1}{2}(m + \tfrac{1}{2})\lambda \qquad (4)$$

Where λ is the wavelength of the third surface acoustic wave excited from the waveguides, and m is 0 or a positive integer. And the array pitch of waveguides is formed to be equal to a whole multiple of λ.

In the previous examples, each waveguide was divided into two or three regions, but may be divided into the four or more regions.

In the twelfth to fourteenth example as previously described, the step was formed on the waveguide, but if the step is provided on the output transducer, the influence of signal upon the reflected wave can be suppressed. This example will be described in the following.

Figure 20:
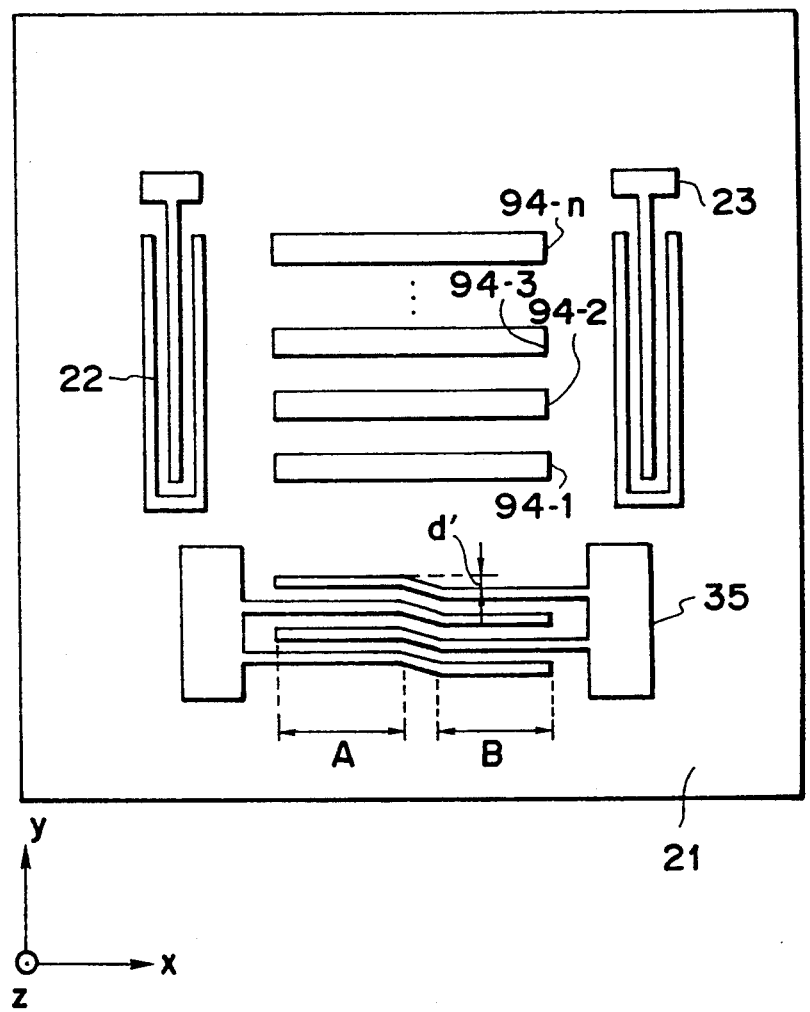

FIG. 20 is a schematic plan view showing a fifteenth example of a surface acoustic wave device according to the present invention. In FIG. 20, the same numerals are attached to the same parts as in FIG. 3, and the detailed explanation will be omitted.

This example is constituted in the same way as the first example except that surface acoustic wave waveguides 94-1, 94-2, . . . , 94-n are formed between transducers 22 and 23. Each of the waveguides 94-1 to 94-n produced a third surface, acoustic wave propagating in a direction parallel to the y axis, or in a direction orthogonal to the propagating direction of first and second surface acoustic waveguides, with the interaction between the first and second surface acoustic waves, as in the first example. The third surface acoustic wave is picked up after conversion into an electric signal with an output transducer 35. Assuming the wavelength of the third surface acoustic wave to be λ, the waveguides are arranged so that the array pitch of those waveguides is equal to the wavelength λ.

The output transducer 35 is divided into two regions of region A and region B in the propagating direction of the first and second surface acoustic waves, or in the x axis direction. The transducer 35 is of a flexed shape so that the side edge (end face) for each region forms a step d' of (¼)λ in the propagating direction of the third surface acoustic wave, or in the y axis.

With such a constitution, the device of this example has a phase difference of (½)λ between the wave reflected at the region A and the wave reflected at the region B when a part of the surface acoustic wave entered into the transducer 35 is reflected from the transducer 35. Therefore, the reflected wave from the transducer 35 which is then reflected at the waveguide again has also a phase difference of (½)λ between the regions A and B. In other words, the reflected wave from the waveguide is in reverse phase. Accordingly, when these reflected waves enter the output transducer 35, the signals converted from the reflected waves electrically cancel each other, having no influence upon the signal from the third surface acoustic wave.

While in the this example, the step d' of the output transducer was formed to be equal to (¼)λ, in general, the same effects as in this example can be obtained, if the step d is formed to satisfy the following conditional expression $$d' = \tfrac{1}{2}(m + \tfrac{1}{2})\lambda \qquad (5)$$

Where λ is the wavelength of the third surface acoustic wave excited from the waveguide, and m is 0 or a positive integer. And in the previous examples, the output transducer was divided into two regions, but can be divided into three or more regions.

Figure 21:
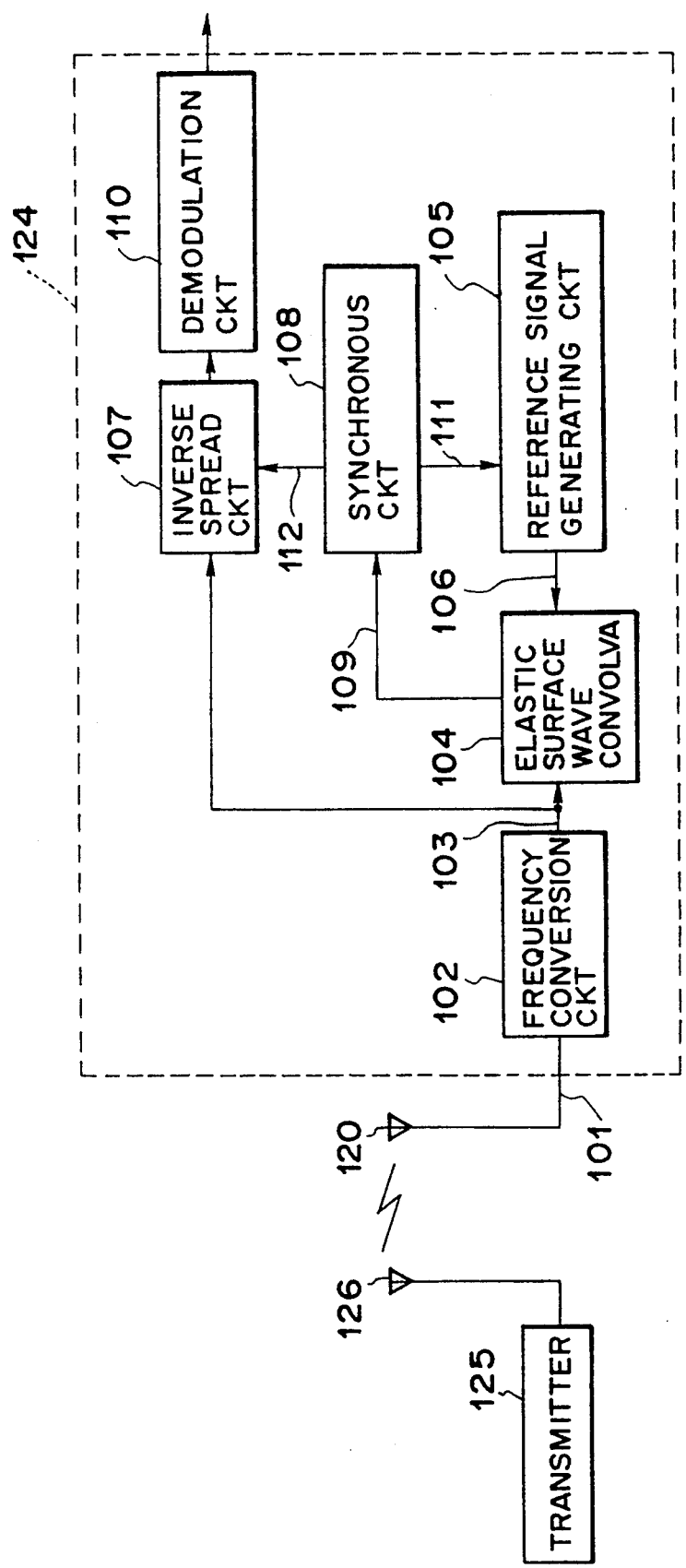
FIG. 21 is a block diagram showing an example of a communication system using a surface acoustic wave device according to the present invention.

FIG. 21 is a block diagram showing an example of a communication system using such a surface acoustic wave device as above described as the convolver. In FIG. 21, numeral 125 indicates a transmitter. This transmitter spreads spectrum for a signal to be transmitted and transmits the signal from an antenna 126. A transmitted signal is received at an antenna 120 of a receiver 124, and a received signal 101 is input to a frequency conversion circuit 102. An IF signal 103, the frequency of which is converted to match with an input frequency of surface acoustic wave convolver in a frequency conversion circuit 102, is input to a convolver consisting of a surface acoustic wave device 104 of the present invention as shown in FIGS. 3 to 20. Hereby, the IF signal 103 is input to one input transducer of the convolver, e.g. a transducer 22 of FIG. 3.

On the other hand, a reference signal 106 output from a reference signal generating circuit 105 is input to the other input transducer of the surface acoustic wave convolver 104, e.g. a transducer 23 of FIG. 3. And in the convolver 104, the convolution (correlation) operation of the IF signal 103 and the reference signal 106 is performed as previously described, and an output signal (convolution signal) 109 is output from an output transducer, e.g., a transducer 25 of FIG. 3.

Figure 22:
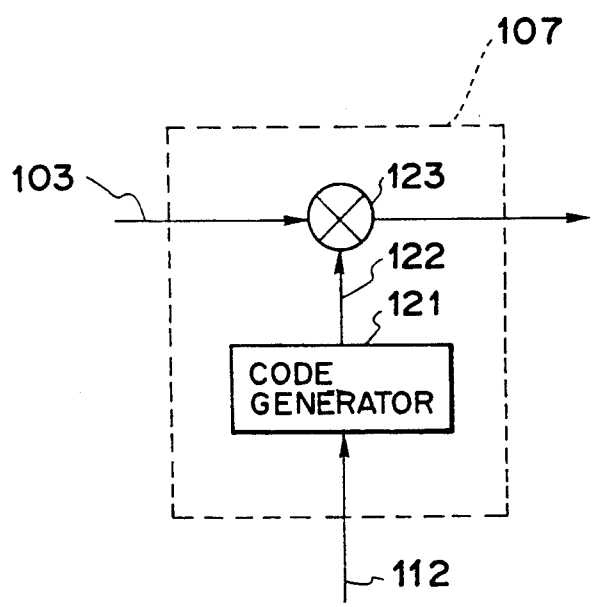
FIG. 22 is a block diagram showing a specific constitutional example of an inverse spread circuit of FIG. 21.

This output signal 109 is input to a synchronous circuit 108. The synchronous circuit 108 produces synchronizing signals 111 and 112 from the output signal 109 of the surface acoustic wave convolver 104, which are input into the reference signal generating circuit 105 and an inverse spread circuit 107, respectively. The reference signal generating circuit 105 outputs the reference signal 106 at the timing regulated with a synchronizing signal 111. The inverse spread circuit 107 restores the IF signal 103 to a signal before the spread spectrum, using a synchronizing signal 112. This signal is converted into an information signal in a demodulation circuit 110 and then output. FIG. 22 shows a configuration example of the inverse spread circuit 107. In FIG. 22, 121 is a code generator, and 123 is a multiplier. The synchronizing signal 112 output from the synchronous circuit 108 is input into the code generator 121, and a code 122 having its timing adjusted with that synchronizing signal 112 is output therefrom. The IF signal 103 and the code 122 are input into the multiplier 123, and a multiplied result of IF signal 103 and code 122 is output therefrom. At this time, if the timing between the IF signal 103 and the code 122 is coincident, the IF signal 103 is converted into a signal before the spread spectrum and then output.

It is noted that when the frequency of received signal 101 is coincident with the input frequency of surface acoustic wave convolver 104, the frequency conversion circuit 102 is unnecessary, in which the received signal 101 can be input through an amplifier and a filter directly into the surface acoustic wave convolver 104. Also in FIG. 21, in order to make the explanation more clearly, the amplifier and the filter are omitted, whereas the amplifier and the filter may be inserted at previous or later stages of each block as required. Moreover, or later while in this example, a transmission signal is received at the antenna 120, it is also possible to connect the transmitter and the receiver with a wire system such as a cable, without using the antenna 120.

Figure 23:
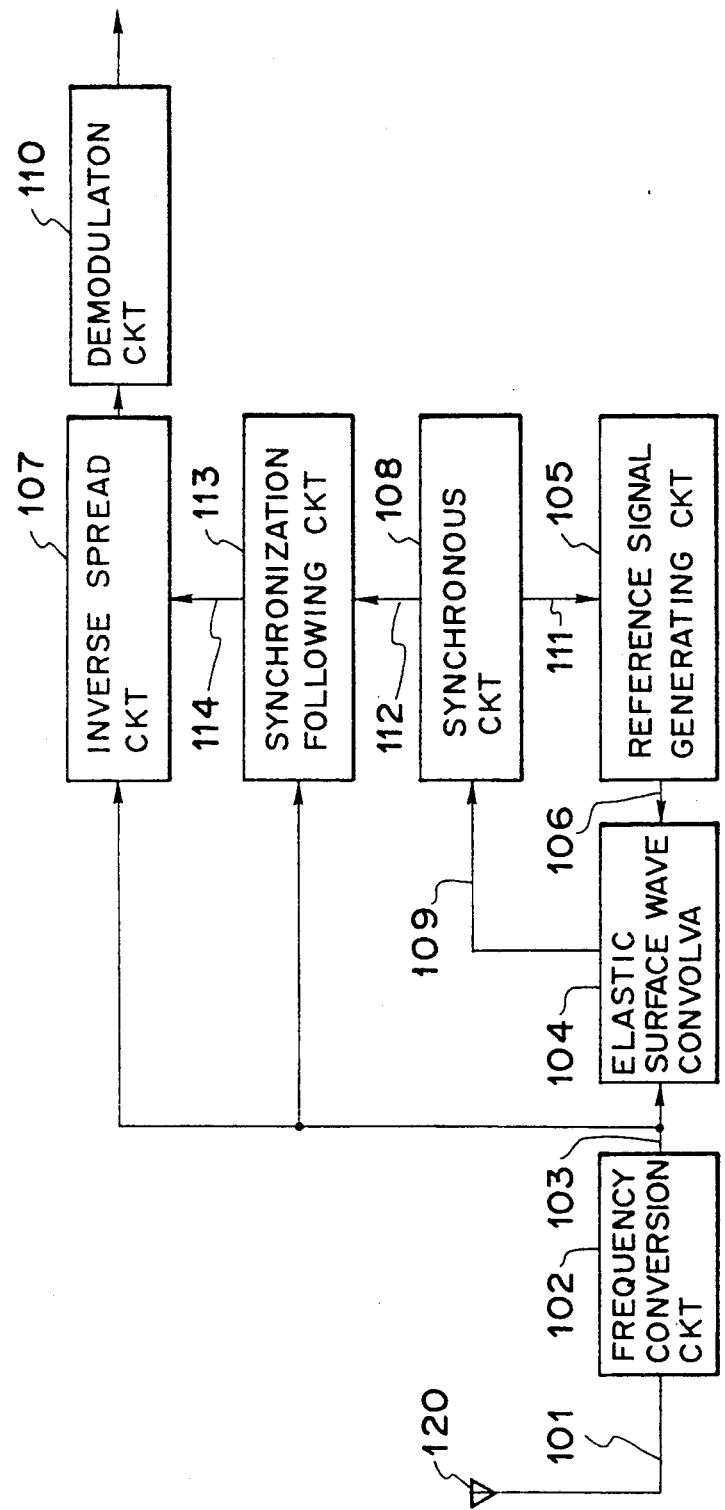

FIG. 23 is a block diagram showing a first variation of receiver 124 in the communication system of FIG. 21. In FIG. 23, the same numerals are appended to the same parts as in FIG. 21, and the detailed explanation is omitted.

In this example, there is provided a synchronization following circuit 113 into which the IF signal 103 is also input. Also, a synchronizing signal 112 output from the synchronous circuit 108 is input to the synchronization following circuit 113, and a synchronizing signal 114 output from the synchronization following circuit 113 is input to the inverse spread circuit 107. This example is different from that of FIG. 21 in these respects. As the synchronization following circuit, there are a tau dither loop circuit and a delay lock loop circuit, either of which can be used.

In this example, the same action effects as those of FIG. 21 can be obtained, but further in this example, the synchronization following is performed such that after synchronization is roughly achieved in a synchronous circuit 108, the synchronization is further made in the synchronization following circuit 113 so as to be more accurate, so that the out-of-phase is not likely to occur and the error rate can be decreased.

Figure 24:
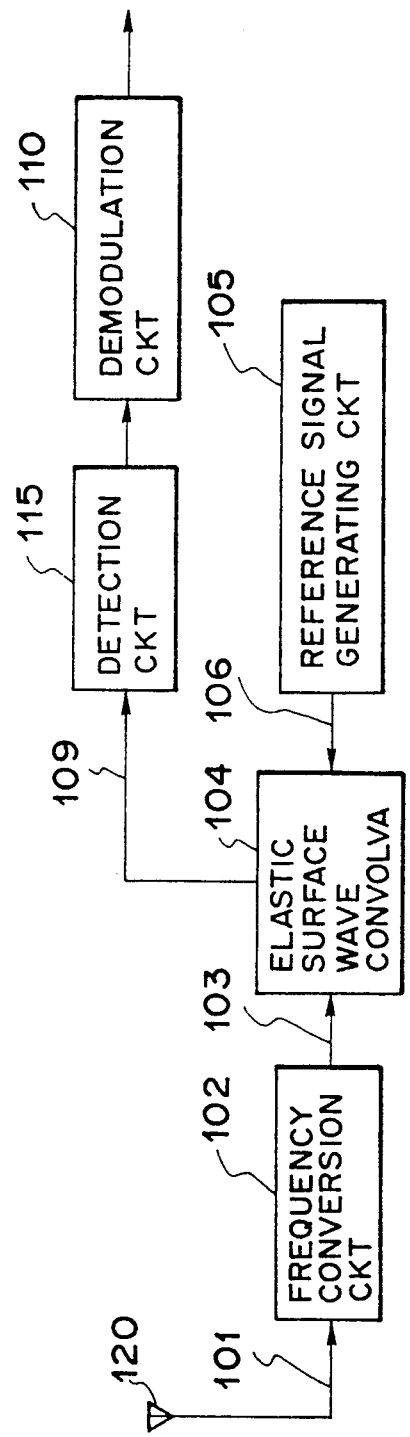

FIG. 24 is a block diagram showing a second variation of receiver 124 in the communication system of FIG. 21. In FIG. 24, the same numerals are appended to the same parts as in FIG. 21, and the detailed explanation is omitted.

In this example, the output from the surface acoustic wave convolver 104 is input to a detection circuit 115, the output of which is used for the demodulation. As the detection circuit 115, there is a synchronous detection circuit, a delay detection circuit or an envelope detection circuit, which can be selected in use depending on the modulation method of signal.

Assuming that the received signal 101 is a modulated signal in phase modulation, frequency modulation or amplitude modulation, the output 109 from the surface acoustic wave convolver 104 is reflective of the modulated information. Particularly, if the length d of waveguide for the surface acoustic wave convolver 104 satisfies d=vT where the time per bit of data is T for the received signal 101 and the velocity of surface acoustic wave is v, the modulated information appears directly on the output 109. For example, assume that a phase modulated signal f(x)exp(j0) is transmitted, and that signal is received as the received signal 101. In this case, if a reference signal g(t) 106 is input to the surface acoustic wave device 104, its output 109 becomes $$\int f(t)\exp(j\theta)\, g(\sigma-t)dt = \exp(j\theta)\int f(t)(\tau-t)dt \tag{6}$$

and the phase modulated information appears. Therefore, the output 109 from the surface acoustic wave element 104 can be demodulated through an appropriate detection circuit 115.

FIG. 25 is a block diagram showing a third variation of receiver 124 of FIG. 21. In FIG. 25, the same numerals are appended to the same parts as in FIG. 24, and the detailed explanation is omitted.

In this example, there is provided a synchronous circuit 108 into which the output 109 from the surface acoustic wave convolver 104 is also input. Also, a synchronizing signal 111 is output from the synchronous circuit 108 and input to the reference signal generating circuit 105. This example is different from that of FIG. 24, in these respects.

In this example, the same action effects as those of FIG. 24 can be obtained, but further in this example, by providing the synchronous circuit 108 and controlling the reference signal generating circuit 105 with the synchronizing signal 111 output from the synchronous circuit 108, the synchronization can be made more stably.

The present invention allows various applications to be made, other than the above examples. For example, in the first to fifteenth examples, the output transducer was provided on one side in a negative direction of the y axis relative to the waveguide. However, the third surface acoustic wave is excited not only in the negative direction of the y axis, but also in the positive direction of the y axis. Accordingly, the output transducers can be provided on both sides in the y axis direction relative to the waveguide so as to pick up the addition of output signals from those transducers. In this case, by disposing the output transducers at different distances away from the waveguide, the output from one transducer can be picked up with a desired time of delay from the output of the other transducer.

As the output transducer, a single electrode was used in this example, but a double electrode (split electrode) or other structures capable of suppressing the reflection can be used to make the characteristics of the device more even better. Also, by forming the input transducer of the double electrode (split electrode), it is possible to suppress the reflection of surface acoustic waves on the electrodes 2, 3 for excitation of a surface acoustic wave, so that the, characteristics of the device can be made even better still. Furthermore, the substrate is not limited to a lithium niobate crystal, but may be sufficient with a material or structure having the parametric mixing effect, for example, a structure in which a piezoelectric film is added onto a semiconductor or glass substrate.

Also, in the above example, the surface acoustic wave excited by the input transducer is directly led into the waveguide, but a beam width compressor such as a horn-type waveguide or multistrip coupler may be provided therebetween.

Note that the coordinate axis shown in each view of the invention is appended for convenience, but not meaning the crystal axis of the substrate.

What is claimed is:

1. A surface acoustic wave device comprising:
   a substrate;
   a plurality of input transducers formed on said substrate for generating first and second surface acoustic waves propagating in opposite directions to each other;
   a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and on at least two of said waveguides, third surface acoustic waves reflected at respective side edges canceling each other; and
   an output transducer for converting the third surface acoustic waves propagating from said waveguides into an electric signal.

2. The surface acoustic wave device according to claim 1, wherein on at least two of said waveguides, the distance between said edges on at least one side in a direction where said waveguides are arranged is an odd multiple of a quarter wavelength of the third surface acoustic wave.

3. The surface acoustic wave device according to claim 1, wherein assuming the wavelength of the third surface acoustic wave to be $\lambda$, the width of each said waveguide is substantially equal to $(\frac{1}{2})\lambda$, and when two of said waveguides are grouped as a pair, those pairs are arranged at a constant pitch substantially equal to $\lambda$.

4. The surface acoustic wave device according to claim 1, wherein when the wavelength of the third surface acoustic wave is $\lambda$, and m is zero or a positive integer, two kinds of waveguides having different widths from each other are alternately arranged at a constant pitch substantially equal to a whole multiple of $\lambda$, the difference between widths of adjacent waveguides being substantially equal to $(m+\frac{1}{2})\lambda$.

5. The surface acoustic wave device according to claim 4, wherein said waveguides comprise a plurality of waveguides having the width substantially equal to $\lambda$ and a plurality of waveguides having a width substantially equal to $(\frac{1}{2})\lambda$ alternately arranged at a constant pitch substantially equal to $\lambda$.

6. The surface acoustic wave device according to claim 4, wherein said waveguides comprise a plurality of waveguides having a width substantially equal to $(\frac{7}{8})\lambda$ and a plurality of waveguides having a width substantially equal to $(\frac{3}{8})\lambda$ alternately arranged at a constant pitch substantially equal to $\lambda$.

7. The surface acoustic wave device according to claim 4, wherein said waveguides comprise a plurality of waveguides having a width substantially equal to $(\frac{3}{4})\lambda$ and a plurality of waveguides having a width substantially equal to $(\frac{1}{4})\lambda$ alternately arranged at a constant pitch substantially equal to $\lambda$.

8. The surface acoustic wave device according to claim 4, wherein said waveguides comprise a plurality of waveguides having a width substantially equal to $(9/8)\lambda$ and a plurality of waveguides having a width substantially equal to $(\frac{5}{8})\lambda$ alternately arranged at a constant pitch substantially equal to $\lambda$.

9. The surface acoustic wave device according to claim 1, wherein when the wavelength of the third surface acoustic wave is $\lambda$, and m is zero or a positive interger, said waveguides are arranged at a constant pitch substantially equal to a whole multiple of $\lambda$, and when two adjacent waveguides are grouped as a pair, each pair of said waveguides have different widths from each other, with the difference between widths of two waveguides for each pair being substantially equal to $(m+\frac{1}{2})\lambda$.

10. The surface acoustic wave device according to claim 9, wherein said waveguides are arranged at a constant pitch substantially equal to $\lambda$, each pair of said waveguides comprising waveguides having a width substantially equal to $(\frac{3}{4})\lambda$ and waveguides having a width substantially equal to $(\frac{1}{4})\lambda$.

11. The surface acoustic wave device according to claim 1, wherein assuming that the wavelength of the third surface acoustic wave is $\lambda$, and m and n are integers, when two waveguides are grouped as a pair, those pairs of waveguides are arranged at a constant pitch substantially equal to a whole multiple of $2\lambda$, wherein assuming that the width of one waveguide for each pair is a, the width of the other waveguide for each pair is b, and the interval between two waveguides for each pair is c, the following condition is satisfied, $$a+b=\tfrac{1}{2}(m+\tfrac{1}{2})\lambda$$

$$b+c=\tfrac{1}{2}(n+\tfrac{1}{2})\lambda.$$

12. The surface acoustic wave device according to claim 11, wherein said pairs of waveguides are arranged at a constant pitch substantially equal to λ, each pair of waveguides comprising two waveguides having a width substantially equal to $(\tfrac{1}{8})\lambda$ and the interval of two waveguides for each pair being substantially equal to $(\tfrac{3}{8})\lambda$.

13. The surface acoustic wave device according to claim 11, wherein said pairs of waveguides are arranged at a constant pitch substantially equal to 2λ, each pair of waveguides comprising waveguides having a width substantially equal to $(\tfrac{3}{8})\lambda$ and waveguides having a width substantially equal $(\tfrac{5}{8})\lambda$, the interval of two waveguides for each pair being substantially equal to $(\tfrac{3}{8})\lambda$.

14. A signal receiver comprising:
 (a) a circuit for receiving a modulated signal transmitted from a transmitter;
 (b) a circuit for generating a reference signal;
 (c) a surface acoustic wave device for outputting a convolution signal of the modulated signal and the reference signal; and
 (d) a circuit for demodulating the information using said convolution signal output from said surface acoustic wave device;
 wherein said surface acoustic wave device comprises:
 a substrate;
 a first input transducer formed on said substrate for generating a first surface acoustic wave corresponding to the modulated signal;
 a second input transducer formed on said substrate for generating a second surface acoustic wave corresponding to the reference signal;
 a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and on at least two of said waveguides, the third surface acoustic waves reflected at respective side edges canceling each other; and
 an output transducer for converting the third surface acoustic waves propagating from said waveguides into an electrical signal.

15. The signal receiver according to claim 14, wherein on at least two waveguides of said surface acoustic wave device, the distance between side edges on at least one side of waveguide in a direction where said waveguides are a is an odd multiple of a quarter wavelength of the third surface acoustic wave.

16. The signal receiver accord to claim 14, wherein assuming the wavelength of the third surface acoustic wave to be λ, said surface acoustic wave device comprises waveguides having a width substantially equal to $(\tfrac{1}{2})\lambda$, and when two waveguides are grouped as a pair, said pairs of waveguides are arranged at a constant pitch substantially equal to λ.

17. The signal receiver according to claim 14, wherein when the wavelength of the third surface acoustic wave is λ, and m is zero or a positive integer, said surface acoustic wave device has two kinds of waveguides having different widths from each other alternately arranged at a constant pitch substantially equal to a whole multiple of λ, the difference between widths of adjacent waveguides being substantially equal to $(m+\tfrac{1}{2})\lambda$.

18. The signal receiver according to claim 14, wherein when the wavelength of the third surface acoustic wave is λ, and m is zero or a positive integer, said surface acoustic wave device has said waveguides arranged at a constant pitch substantially equal to a whole multiple of λ, and when two adjacent waveguides are paired, each pair including said waveguides having different widths from each other, the difference between widths of two waveguides for each pair being substantially equal to $(m+\tfrac{1}{2})\lambda$.

19. The signal receiver according to claim 14, wherein assuming that the wavelength of the third surface acoustic wave is λ, and m and n are integers, when two waveguides are grouped as a pair, said surface acoustic wave device comprises those pairs of waveguides arranged at a constant pitch substantially equal to a whole multiple of 2λ, wherein assuming that the width of one waveguide for each pair is a, the width of said other waveguide for each pair is b, and the interval between said two waveguides for each pair is c, the following condition is satisfied, $$a+b=\tfrac{1}{2}(m+\tfrac{1}{2})\lambda$$

$$b+c=\tfrac{1}{2}(n+\tfrac{1}{2})\lambda.$$

20. A communication system comprising:
 (a) a transmitter for transmitting a signal modulated in accordance with information;
 (b) a circuit for receiving a modulated signal transmitted from said transmitter;
 (c) a circuit for generating a reference signal;
 (d) a surface acoustic wave device for outputting a convolution signal of the modulated signal and the reference signal; and
 (e) a circuit for demodulating the information signal using said convolution signal output from said surface acoustic wave device;
 wherein said surface acoustic wave device comprises:
 a substrate;
 a first input transducer formed on said substrate for generating a first surface acoustic wave corresponding to the modulated signal;
 a second input transducer formed on said substrate for generating a second surface acoustic wave corresponding to the reference signal;
 a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surfaces acoustic waves, and on at least two of said waveguides, the third surface acoustic waves reflected at respective side edges canceling each other; and
 an output transducer for converting the third surface acoustic waves propagating from said waveguides into an electric signal.

21. The communication system according to claim 20, wherein on at least two waveguides of said surface acoustic wave device, the distance between side edges on at least one side for one of said waveguides in a direction where said waveguides are arranged in an odd multiple of a quarter wavelength of the third surface acoustic wave.

22. The communication system according to claim 20, wherein assuming the wavelength of the third surface acoustic wave to be $\lambda$, said surface acoustic wave device has said waveguides having a width substantially equal to $(\frac{1}{4})\lambda$, and when two waveguides are grouped as a pair, said pairs of waveguides are arranged at a constant pitch substantially equal to $\lambda$.

23. The communication system according to claim 20, wherein when the wavelength of the third surface acoustic wave is $\lambda$, and m is zero or a positive integer, said surface acoustic wave device has two kinds of waveguides having different widths from each other alternately arranged at a constant pitch substantially equal to a whole multiple of $\lambda$, the difference between widths of adjacent waveguides being substantially equal to $(m+\frac{1}{2})\lambda$.

24. The communication system according to claim 20, wherein when the wavelength of the third surface acoustic wave is $\lambda$, and m is zero or a positive integer, said surface acoustic wave device has said waveguides arranged at a constant pitch substantially equal to a whole multiple of $\lambda$, and when two adjacent waveguides are grouped as pair, each pair including said waveguides having different widths from each other, the difference between widths of said two waveguides being substantially equal to $(m+\frac{1}{2})\lambda$.

25. The communication system according to claim 20, wherein assuming that the wavelength of the third surface acoustic wave is $\lambda$, and m and n are integers, when two waveguides are grouped as a pair, said surface acoustic wave device comprises said pairs of waveguides arranged at a constant pitch substantially equal to a whole multiple of $2\lambda$, wherein assuming that the width of one waveguide for each pair is a, the width of the other waveguide for each pair is b, and said interval between said two waveguides for each pair is c, the following condition is satisfied, $a+b=\frac{1}{2}(m+\frac{1}{2})\lambda$ $b+c=\frac{1}{2}(n+\frac{1}{2})\lambda$.

26. A surface acoustic wave device comprising:
a substrate;
a plurality of input transducers formed on said substrate for generating first and second surface acoustic waves propagating in opposite directions to each other;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and on at least two waveguides, the distance between side edges on at least one side for a waveguide in the direction where said waveguides are arranged is an odd multiple of a quarter wavelength of the third surface acoustic wave; and
an output transducer for converting the third surface acoustic waves propagating from said waveguides into an electric signal.

27. The surface acoustic wave device according to claim 26, wherein assuming the wavelength of the third surface acoustic wave to be $\lambda$, a width of said waveguide is substantially equal to $(\frac{1}{4})\lambda$, and when two waveguides are grouped as a pair, those pairs of waveguides are arranged at a constant pitch substantially equal to $\lambda$.

28. The surface acoustic wave device according to claim 26, wherein when the wavelength of the third surface acoustic wave is $\lambda$, and m is zero or a positive integer, two kinds of waveguides having different widths from each other are alternately arranged at a constant pitch substantially equal to a whole multiple of $\lambda$, the difference between widths of adjacent waveguides being substantially equal to $(m+\frac{1}{2})\lambda$.

29. The surface acoustic wave device according to claim 28, wherein said waveguides consist of a plurality of waveguides having a width substantially equal to $\lambda$ and a plurality of waveguides having a width substantially equal to $(\frac{1}{2})\lambda$ alternately arranged at a constant pitch substantially equal to $\lambda$.

30. The surface acoustic wave device according to claim 28, wherein said waveguides consist of a plurality of waveguides having a width substantially equal to $(\frac{7}{8})\lambda$ and a plurality of waveguides having a width substantially equal to $(\frac{3}{8})\lambda$ alternately arranged at a constant pitch substantially equal to $\lambda$.

31. The surface acoustic wave device according to claim 28, wherein said waveguides consist of a plurality of waveguides having a width substantially equal to $(\frac{3}{4})\lambda$ and a plurality of waveguides having a width substantially equal to $(\frac{1}{4})\lambda$ alternately arranged at a constant pitch substantially equal to $\lambda$.

32. The surface acoustic wave device according to claim 28, wherein said waveguides consist of a plurality of waveguides having a width substantially equal to $(9/8)\lambda$ and a plurality of waveguides having a width substantially equal to $(\frac{5}{8})\lambda$ alternately arranged at a constant pitch substantially equal to $\lambda$.

33. The surface acoustic wave device according to claim 26, wherein when the wavelength of the third surface acoustic wave is $\lambda$, and m is zero or a positive integer, said waveguides are arranged at a constant pitch substantially equal to a whole multiple of $\lambda$, and when two adjacent waveguides are grouped as a pair, each pair comprises waveguides having different widths from each other, the difference between widths of two waveguides for each pair being substantially equal to $(m+\frac{1}{2})\lambda$.

34. The surface acoustic wave device according to claim 33, wherein said waveguides are arranged at a constant pitch substantially equal to $\lambda$, each pair of waveguides comprising a waveguide having a width substantially equal to $(\frac{3}{4})\lambda$ and a waveguide having a width substantially equal to $(\frac{1}{4})\lambda$.

35. The surface acoustic wave device according to claim 26, wherein assuming that the wavelength of the third surface acoustic wave is $\lambda$, and m and n are integers, when two waveguides are grouped as a pair, said pairs of waveguides are arranged at a constant pitch substantially equal to a whole multiple of $2\lambda$, wherein assuming that a width of one waveguide for each pair is a, a width of the other waveguide for each pair is b, and the interval between two waveguides for each pair is c, the following condition is satisfied, $$a+b=\tfrac{1}{2}(m+\tfrac{1}{2})\lambda$$

$$b+c=\tfrac{1}{2}(n+\tfrac{1}{2})\lambda.$$

36. The surface acoustic wave device according to claim 35, wherein said pairs of waveguides are arranged at a constant pitch substantially equal to 2λ, each pair of waveguides comprising two waveguides having a width substantially equal to ($\tfrac{1}{4}$)λ and the interval between two waveguides for each pair being substantially equal to ($\tfrac{1}{4}$)λ.

37. The surface acoustic wave device according to claim 35, wherein said pairs of waveguides are arranged at a constant pitch substantially equal to 2λ, each pair of waveguides comprising a waveguide having a width substantially equal to ($\tfrac{3}{8}$)λ and a waveguide having a width substantially equal to ($\tfrac{1}{8}$)λ, the interval between two waveguides for each pair being substantially equal to ($\tfrac{3}{8}$)λ.

38. A signal receiver comprising:
(a) a circuit for receiving a modulated signal transmitted from a transmitter;
(b) a circuit for generating a reference signal;
(c) a surface acoustic wave device for outputting a convolution signal of the modulated signal the reference signal; and
(d) a circuit for demodulating the information using said convolution signal output from said surface acoustic wave device;
wherein said surface acoustic wave device comprises:
a substrate;
a first input transducer formed on said substrate for generating a first surface acoustic wave corresponding to the modulated signal;
a second input transducer formed on said substrate for generating a second surface acoustic wave corresponding to the reference signal;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and on at least two of said waveguides, the distance between side edges on at least one side of a waveguide is an odd multiple of a quarter wavelength of the third surface acoustic wave; and
an output transducer for converting third surface acoustic waves propagating from said waveguides into an electric signal.

39. The signal receiver according to claim 38, wherein assuming the wavelength of the third surface acoustic wave to be λ, said surface acoustic wave device comprises waveguides having a width substantially equal to ($\tfrac{1}{4}$)λ, and when two waveguides are grouped as a pair, said pairs of waveguides are arranged at a constant pitch substantially equal to λ.

40. The signal receiver according to claim 38, wherein when the wavelength of the third surface acoustic wave is λ, and m is zero or a positive integer, said surface acoustic wave device has two kinds of waveguides having different widths from each other alternately arranged at a constant pitch substantially equal to a whole multiple of λ, the difference between widths of adjacent waveguides being substantially equal to (m+$\tfrac{1}{2}$)λ.

41. The signal receiver according to claim 38, wherein when the wavelength of the third surface acoustic wave is λ, and m is zero or a positive, integer, said surface acoustic wave device has said waveguides arranged at a constant pitch substantially equal to a whole multiple of λ, and when two adjacent waveguides are grouped as a pair, each pair including the waveguides having different widths from each other, the difference between widths of two waveguides for each pair being substantially equal to (m+$\tfrac{1}{2}$)λ.

42. The signal receiver according to claim 38, wherein assuming that the wavelength of the third surface acoustic wave is λ, and m and n are integers, when two waveguides are grouped as a pair, said surface acoustic wave device comprises said pairs of waveguides arranged at a constant pitch substantially equal to a whole multiple of 2λ, wherein assuming that the width of one waveguide for each pair is a, said width of the other waveguide for each pair is b, and the interval between two waveguides for each pair is c, the following condition is satisfied, $$a+b=\tfrac{1}{2}(m+\tfrac{1}{2})\lambda$$

$$b+c=\tfrac{1}{2}(n+\tfrac{1}{2})\lambda.$$

43. A communication system comprising:
(a) a transmitter for transmitting a signal modulated in accordance with information;
(b) a circuit for receiving a modulated signal transmitted from said transmitter;
(c) a circuit for generating a reference signal;
(d) a surface acoustic wave device for outputting a convolution signal of the modulated signal and the reference signal; and
(e) a circuit for demodulating the information using said convolution signal output from said surface acoustic wave device;
wherein said surface acoustic wave device comprises:
a substrate;
a first input transducer formed on said substrate for generating a first surface acoustic wave corresponding to the modulated signal;
a second input transducer formed on said substrate for generating a second surface acoustic wave corresponding to the reference signal;
a plurality of waveguides arranged in a direction orthogonal to the propagating direction of the first and second, surface acoustic waves on a region where the first and second surface acoustic waves overlap, each waveguide producing a third surface acoustic wave propagating in a direction where said waveguides are arranged, with the interaction between said first and second surface acoustic waves, and on at least two of those waveguides, the distance between side edges on at least one side for waveguide is an odd multiple of a quarter wavelength for the third surface acoustic wave; and
an output transducer for converting the third surface acoustic waves propagating from the waveguides into an electric signal.

44. The communication system according to claim 43, wherein assuming the wavelength of the third surface acoustic wave to be λ, said surface acoustic wave device has said waveguides having a width substantially equal to ($\tfrac{1}{4}$)λ, and when two waveguides are grouped as a pair, said pairs of waveguides are arranged at a constant pitch substantially equal to λ.

45. The communication system according to claim 43, wherein when the wavelength of the third surface acoustic wave is λ, and m is zero or a positive integer, said surface acoustic wave device has two kinds of waveguides having different widths from each other alternately arranged at a constant pitch substantially equal to a whole multiple of λ, the difference between widths of adjacent waveguides being substantially equal to $(m+\frac{1}{2})\lambda$.

46. The communication system according to claim 43, wherein when the wavelength of the third surface acoustic wave is λ, and m is zero or a positive integer, said surface acoustic wave device has said waveguides arranged at a constant pitch substantially equal to a whole multiple of λ, and when two adjacent waveguides are grouped as a pair, each pair including waveguides having different widths from each other, the difference between widths of two waveguides for each pair being substantially equal to $(m+\frac{1}{2})\lambda$.

47. The communication system according to claim, 43, wherein assuming that the wavelength of the third surface acoustic wave is λ, and m and n are integers, when two waveguides are grouped as a pair, said surface acoustic wave device comprises said pairs of waveguides arranged at a constant pitch substantially equal to a whole multiple of 2λ, wherein assuming that the width of one waveguide for each pair is a, said width of the other waveguide for each pair is b, and the interval between two waveguides for each pair is c, the following condition is satisfied, $$a+b=\tfrac{1}{2}(m+\tfrac{1}{2})\lambda$$

$$b+c=\tfrac{1}{2}(n+\tfrac{1}{2})\lambda.$$

48. A surface acoustic wave device comprising:
a substrate;
a plurality of input transducers formed on said substrate for generating first and second surface acoustic waves propagating in opposite directions to each other;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and the distance between edges on the same side for waveguides in a direction where said waveguides are arranged is random; and
an output transducer for converting the third surface acoustic waves propagating from said waveguides into an electric signal.

49. The surface acoustic wave device according to claim 48, wherein said waveguides consist of a plurality of waveguides having random widths arranged at a pitch substantially equal to the wavelength of the third surface acoustic wave.

50. A signal receiver comprising:
(a) a circuit for receiving a modulated signal transmitted from a transmitter;
(b) a circuit for generating a reference signal;
(c) a surface acoustic wave device for outputting a convolution signal of the modulated signal and the reference signal; and
(d) a circuit for demodulating the information using the convolution signal output from said surface acoustic wave device;
wherein said surface acoustic wave device comprises:
a substrate;
a first input transducer formed on said substrate for generating a first surface acoustic wave corresponding to the modulated signal;
a second input transducer formed on said substrate for generating a second surface acoustic wave corresponding to the reference signal;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and the distances between edges on the same side for waveguides in a direction where said waveguides are arranged in random; and
an output transducer for converting the third surface acoustic waves propagating from said waveguides into an electric signal.

51. The signal receiver according to claim 50, wherein said surface acoustic wave device comprises a plurality of waveguides having random widths arranged at a pitch substantially equal to the wavelength of the third surface acoustic wave.

52. A communication system comprising:
(a) a transmitter for transmitting a signal modulated in accordance with information;
(b) a circuit for receiving a modulated signal transmitted from said transmitter;
(c) a circuit for generating a reference signal;
(d) a surface acoustic wave device for outputting a convolution signal of the modulated signal and the reference signal; and
(e) a circuit for demodulating the information using the convolution signal output from said surface acoustic wave device;
wherein said surface acoustic wave device comprises:
a substrate;
a first input transducer formed on said substrate for generating a first surface acoustic wave corresponding to the modulated signal;
a second input transducer formed on said substrate for generating a second surface acoustic wave corresponding to the reference signal;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and the distance between edges on the same side for waveguides in a direction where said waveguides are arranged is random; and
an output transducer for converting the third surface acoustic waves propagating from said waveguides into an electric signal.

53. The communication system according to claim 52, wherein said surface acoustic wave device comprises a plurality of waveguides having random widths arranged at a pitch substantially equal to the wavelength of the third surface acoustic wave.

54. A surface acoustic wave device comprising:
- a substrate;
- a plurality of input transducers formed on said substrate for generating first and second surface acoustic waves propagating in opposite directions to each other;
- a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and each waveguide is divided into a plurality of regions in the propagating direction of the first and second surface acoustic waves, a side end portion of each region for each waveguide having a step in a magnitude of an odd multiple of a quarter wavelength of the third surface acoustic wave in a direction where said waveguides are arranged; and
- an output transducer for converting the third surface acoustic waves propagating from said waveguides into an electric signal.

55. The surface acoustic wave device according to claim 54, wherein said waveguides consist of a plurality of waveguides having different widths depending on the region arranged at a pitch substantially equal to the wavelength of the third surface acoustic wave.

56. The surface acoustic wave device according to claim 54, wherein said waveguides consist of a plurality of waveguides having a flexed shape between each region arranged at a pitch substantially equal to the wavelength of the third surface acoustic wave.

57. A signal receiver comprising:
(a) a circuit for receiving a modulated signal transmitted from a transmitter;
(b) a circuit for generating a reference signal;
(c) a surface acoustic wave device for outputting a convolution signal of a signal received in a reception circuit and the reference signal; and
(d) a circuit for demodulating the information using the convolution signal output from said surface acoustic wave device;
wherein said surface acoustic wave device comprises:
a substrate;
a first input transducer formed on said substrate for generating a first surface acoustic wave corresponding to the signal received in said reception circuit;
a second input transducer formed on said substrate for generating a second surface acoustic wave corresponding to the reference signal;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between said first and second surface acoustic waves, and each waveguide is divided into a plurality of regions in the propagating direction of the first and second surface acoustic waves, a side end portion on each region for each waveguide having a step in a magnitude of an odd multiple of a quarter wavelength of the third surface acoustic wave in a direction where said waveguides are arranged; and
an output transducer for converting the third surface acoustic waves propagating from said waveguides into an electric signal.

58. The signal receiver according to claim 57, wherein said surface acoustic wave device comprises a plurality of waveguides having different widths depending on the region arranged at a pitch substantially equal to the wavelength of the third surface acoustic wave.

59. The signal receiver according to claim 57, wherein said surface acoustic wave device comprises a plurality of waveguides having a flexed shape between each region arranged at a pitch substantially equal to the wavelength of the third surface acoustic wave.

60. A communication system comprising:
(a) a transmitter for transmitting a signal modulated in accordance with information;
(b) a circuit for receiving a modulated signal transmitted from said transmitter;
(c) a circuit for generating a reference signal;
(d) a surface acoustic wave device for outputting a convolution signal of a signal received in a reception circuit and the reference signal; and
(e) a circuit for demodulating the information using the convolution signal output from said surface acoustic wave device;
wherein said surface acoustic wave device comprises:
a substrate;
a first input transducer formed on said substrate for generating a first surface acoustic wave corresponding to the signal received in said reception circuit;
a second input transducer formed on said substrate for generating a second surface acoustic wave corresponding to the reference signal;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves, and each waveguide is divided into a plurality of regions in the propagating direction of the first and second surface acoustic waves, a side edge on each region for each waveguide having a step in a magnitude of an odd multiplier of a quarter wavelength of the third surface acoustic wave in a direction where said waveguides are arranged; and
an output transducer for converting the third surface acoustic waves propagating from said waveguides into an electric signal.

61. The communication system according to claim 60, wherein said surface acoustic wave device comprises a plurality of waveguides having different widths depending on the region arranged at a pitch substantially equal to the wavelength of the third surface acoustic wave.

62. The communication system according to claim 60, wherein said surface acoustic wave device comprises a plurality of waveguides having a flexed shape between each region arranged at a pitch substantially equal to the wavelength of the third surface acoustic wave.

63. A surface acoustic wave device comprising:
a substrate;
a plurality of input transducers formed on said substrate for generating first and second surface acoustic waves propagating in opposite directions to each other;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves; and
an output transducer for converting the third surface acoustic waves propagating from said waveguides into an electric signal, said output transducer is divided into a plurality of sections in the propagating direction of the first and second surface acoustic waves, each section having a step in a magnitude of an odd multiple of a quarter wavelength of the third surface acoustic wave in a direction where said waveguides are arranged.

64. A signal receiver comprising:
(a) a circuit for receiving a modulated signal transmitted from a transmitter;
(b) a circuit for generating a reference signal;
(c) a surface acoustic wave device for outputting a convolution signal of the modulated signal and the reference signal; and
(d) a circuit for demodulating the information using the convolution signal output from said surface acoustic wave device;
wherein said surface acoustic wave device comprises:
a substrate;
a first input transducer formed on said substrate for generating a first surface acoustic wave corresponding to the modulated signal;
a second input transducer formed on said substrate for generating a second surface acoustic wave corresponding to the reference signal;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves; and
an output transducer for converting the third surface acoustic waves propagating from said waveguides into an electric signal, said output transducer is divided into a plurality of sections in the propagating direction of the first and second surface acoustic waves, each section having a step in a magnitude of an odd multiple of a quarter wavelength of the third surface acoustic wave in a direction where said waveguides are arranged.

65. A communication system comprising:
(a) a transmitter for transmitting a signal modulated in accordance with information;
(b) a circuit for receiving a modulated signal transmitted from said transmitter;
(c) a circuit for generating a reference signal;
(d) a surface acoustic wave device for outputting a convolution signal of the modulated signal and the reference signal; and
(e) a circuit for demodulating the information using the convolution signal output from said surface acoustic wave device;
wherein said surface acoustic wave device comprises:
a substrate;
a first input transducer formed on said substrate for generating a first surface acoustic wave corresponding to the modulated signal;
a second input transducer formed on said substrate for generating a second surface acoustic wave corresponding to the reference signal;
a plurality of waveguides arranged in a direction orthogonal to the propagating direction of the first and second surface acoustic waves on a region where the first and second surface acoustic waves overlap, each waveguide producing a third surface acoustic wave propagating in a direction where said waveguides are arranged, with the interaction between the first and second surface acoustic waves; and
an output transducer for converting the third surface acoustic waves propagating from said waveguides into an electric signal, said output transducer is divided into a plurality of sections in the propagating direction of the first and second surface acoustic waves, each section having a step in a magnitude of an odd multiple of a quarter wavelength of the third surface acoustic wave in a direction where said waveguides are arranged.

* * * * *

UNITED STATES PATENT AND TRADEMARK OFFICE
CERTIFICATE OF CORRECTION

PATENT NO. : 5,185,548  
DATED : February 9, 1993  
INVENTOR(S) : Koichi Egara, et al.

It is certified that error appears in the above-indentified patent and that said Letters Patent is hereby corrected as shown below:

ON THE TITLE PAGE:
[56] REFERENCES CITED:

FOREIGN PATENT DOCUMENTS, "02207605  8/1990  Japan" should read --2-207605  8/1990  Japan--.

IN THE DRAWINGS:
SHEET 20:

FIG. 21, "CONVOLVA" should read --CONVOLVER--.

SHEET 22:

FIG. 23, "CONVOLVA" should read --CONVOLVER--.

SHEET 23:

FIG. 24, "CONVOLVA" should read --CONVOLVER--.

SHEET 24:

FIG. 25, "CONVOLVA" should read --CONVOLVER--.

COLUMN 7:

Line 27, "equal" should read --equal to--.

COLUMN 10:

Line 26, "where" should read --where $\lambda$--.

COLUMN 14:

Line 64, "step d" should read --step d'--.

UNITED STATES PATENT AND TRADEMARK OFFICE
CERTIFICATE OF CORRECTION

PATENT NO. : 5,185,548                        Page 2 of 3
DATED     : February 9, 1993
INVENTOR(S): Koichi Egara, et al.

It is certified that error appears in the above-indentified patent and that said Letters Patent is hereby corrected as shown below:

COLUMN 15:

Line 66, "or" (second occurrence) should be deleted.
Line 67, "later" should be deleted.

COLUMN 16:

Line 49, "f(x)exp(j0)" should read --f(x)exp(j$\theta$)--.
Line 54, "$\int$f(t)exp(j$\theta$)g($\sigma$-t)dt = exp(j$\theta$) $\int$f(t)($\tau$-t)dt" should read --"$\int$f(t)exp(j$\theta$)g($\tau$-t)dt = exp(j$\theta$) $\int$f(t) g ($\tau$-t)dt--.

COLUMN 19:

Line 1, "two" should read --said two--.
Line 17, "comprising" should read --comprising two--.
Line 19, "equal" should read --equal to--.
Line 56, "of" should read --of a--.
Line 57, "are a" should read --are arranged--.

COLUMN 21:

Line 5, "in" should read --is--.

COLUMN 22:

Line 67, "two" should read --said two--.

COLUMN 23:

Line 26, "the" (second occurrence) should read --and the--.

UNITED STATES PATENT AND TRADEMARK OFFICE
CERTIFICATE OF CORRECTION

PATENT NO. : 5,185,548

DATED : February 9, 1993

INVENTOR(S) : Koichi Egara, et al.

It is certified that error appears in the above-indentified patent and that said Letters Patent is hereby corrected as shown below:

Column 24:

Line 22, "two" should read --said two--.
    Line 62, "the" should read --said--.

Column 25:

Line 32, "two" should read --said two--.

Column 26:

Line 23, "distances" should read --distance--.

COLUMN 28:

Line 55, "multiplier" should read --multiple--.

Signed and Sealed this

Twenty-fifth Day of January, 1994

Attest:

BRUCE LEHMAN

Attesting Officer     Commissioner of Patents and Trademarks